(12) United States Patent
Daicho et al.

(10) Patent No.: US 11,131,286 B2
(45) Date of Patent: Sep. 28, 2021

(54) IGNITER AND VEHICLE PROVIDED WITH THE SAME

(71) Applicant: Rohm Co., Ltd., Kyoto (JP)

(72) Inventors: Akira Daicho, Kyoto (JP); Atsushi Taguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 193 days.

(21) Appl. No.: 16/356,762

(22) Filed: Mar. 18, 2019

(65) Prior Publication Data
US 2019/0293044 A1 Sep. 26, 2019

(30) Foreign Application Priority Data

Mar. 20, 2018 (JP) .............................. JP2018-052032
Mar. 20, 2018 (JP) .............................. JP2018-052487

(51) Int. Cl.
| | | |
|---|---|---|
| *F02P 3/055* | (2006.01) | |
| *H03K 17/082* | (2006.01) | |
| *F02P 3/08* | (2006.01) | |
| *F02N 11/06* | (2006.01) | |
| *H03K 17/567* | (2006.01) | |

(52) U.S. Cl.
CPC ............ *F02P 3/0552* (2013.01); *F02N 11/06* (2013.01); *F02P 3/08* (2013.01); *H03K 17/082* (2013.01); *H03K 17/567* (2013.01)

(58) Field of Classification Search
CPC ......... F02P 3/05552; F02P 3/08; F02N 11/06; H03K 17/082; H03K 17/567
USPC ...................................................... 123/406.19
See application file for complete search history.

(56) References Cited

U.S. PATENT DOCUMENTS

| | | | | |
|---|---|---|---|---|
| 5,558,074 A | * | 9/1996 | Fukatsu | .................... F02P 3/02 |
| | | | | 123/647 |
| 6,283,104 B1 | * | 9/2001 | Ito | ........................... F02P 3/051 |
| | | | | 123/637 |
| 7,131,437 B2 | * | 11/2006 | Ando | .................... F02P 3/0552 |
| | | | | 123/644 |
| 2005/0178372 A1 | * | 8/2005 | Kesler | .................... F02P 3/055 |
| | | | | 123/630 |
| 2005/0184793 A1 | * | 8/2005 | Torres | ................ H03K 17/0828 |
| | | | | 327/478 |
| 2005/0224909 A1 | * | 10/2005 | Yamaguchi | ............. H01L 25/16 |
| | | | | 257/528 |
| 2008/0006256 A1 | * | 1/2008 | Oono | .................... H03K 17/18 |
| | | | | 123/644 |

(Continued)

FOREIGN PATENT DOCUMENTS

JP 2008-2392 A 1/2008

*Primary Examiner* — Mahmoud Gimie
(74) *Attorney, Agent, or Firm* — Hamre, Schumann, Mueller & Larson, P.C.

(57) ABSTRACT

An igniter includes a switch element with input, output control electrodes, a first lead in contact with the input electrode and connected to a primary coil of an ignition coil, a second lead that is grounded, a third lead spaced apart from the first and second leads, a first bonding wire connecting the output electrode and the third lead, a second bonding wire connecting the third lead and the second lead, and a control IC that drives the switch element based on an ignition instruction signal from an engine control unit. The control IC generates an ignition confirmation signal based on the voltage of the third lead, and outputs the signal to the engine control unit.

28 Claims, 14 Drawing Sheets

(56) References Cited

U.S. PATENT DOCUMENTS

2010/0059028 A1\* 3/2010 Ueno ................. H01L 29/0696
123/652
2019/0120198 A1\* 4/2019 Miyake ................ F02P 3/0442

\* cited by examiner

FIG.10
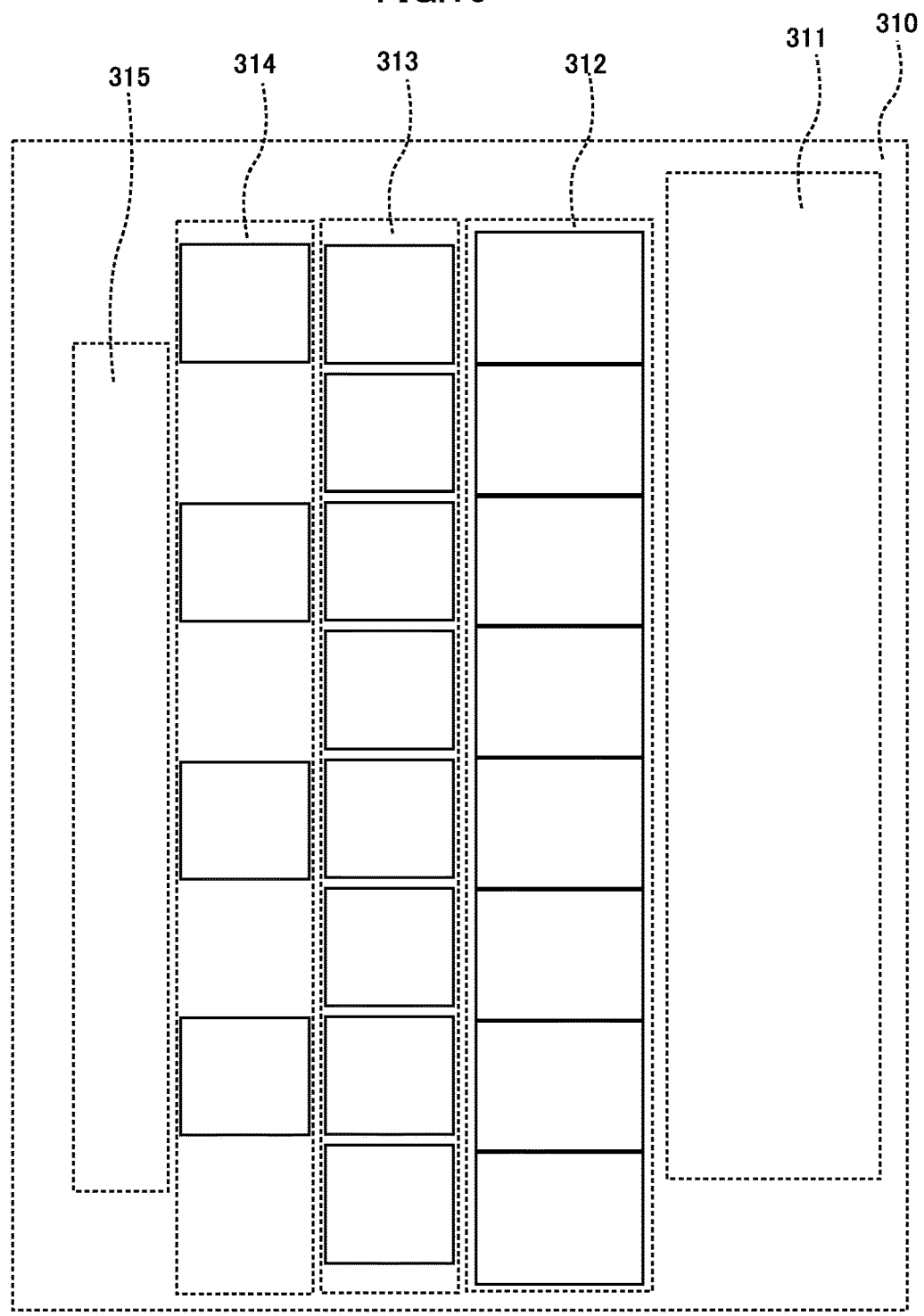
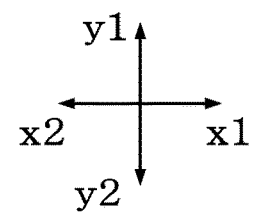

IGNITER AND VEHICLE PROVIDED WITH THE SAME

FIELD

The present disclosure relates to an igniter and a vehicle provided with the igniter.

BACKGROUND

Conventionally, an igniter for controlling an ignition coil of a vehicle engine (e.g., internal combustion engine) is known. For example, Japanese Patent Application Publication No. 2008-2392 discloses an example of an igniter.

FIG. 12 is an explanatory view of an example igniter. The illustrated igniter 100 receives an ignition instruction signal IGT from an engine control unit (ECU) 2 and controls an ignition coil (not shown) based on this signal. The igniter 100 is provided with a control circuit 13, which includes a drive unit (or section) 133 and an ignition confirmation unit (or section) 134. The drive unit 133 controls the gate voltage of a switch element 11 according to the ignition instruction signal IGT, whereby the switch element 11 is selectively turned on and off. When the switch element 11 is changed from on to off, a high voltage is generated in the secondary coil of the ignition coil, and this voltage is applied to the cooperating ignition plug.

The ignition confirmation unit 134 confirms the state of ignition based on current Ic flowing through the switch element 11 (or based on voltage Vcs appearing across the resistor 12). For example, the ignition confirmation unit 134 detects the voltage Vcs generated by the current Ic, and compares the detected voltage Vcs with predetermined reference voltages (e.g., Vref1, Vref2). To this end, the ignition confirmation unit 134 may include at least two comparators, a first comparator (for Vref1) and a second comparator (for Vref2), for performing the respective comparisons. Then, based on the results of the comparison, the ignition confirmation unit 134 generates an ignition confirmation signal IGF that is to be outputted to the engine control unit (ECU) 2.

FIG. 13 is a plan view showing the internal layout of the igniter 100. As shown in the figure, the switch element 11 is mounted on a first lead 404, and the control circuit 13 is mounted on a second lead 402, which is to be grounded (GND). The emitter electrode (pad 601) of the switch element 11 is connected to the lead 402 by a first wire 510. The pad 601 is also connected to a pad 206 of the control circuit 13 by a second wire 506. The first wire 510 has a predetermined resistance so as to function as a resistor as well. In the igniter 100, the wire 510 (and the related portion such as the junction or bonding point between the wire 510 and the pad 601, etc.) is used as a current detection resistor 12.

In operation of the igniter 100 (in power cycles), a portion of the sealing resin around or near the wire 510 will expand or contract by being alternately subjected to the heat generated by the switch element 11 and the cooling of the switch element 11 (when not energized). As a result, a crack may be formed in the joint between the wire 510 and the pad 601. When such a crack is formed, the resistance value of the junction may increase, and accordingly the resistance of the current detection resistor 12 may also increase. As a result, the detection voltage Vcs (see FIG. 12) becomes unduly high. In such an instance, however, the ignition confirmation unit 134 may output a signal indicating the occurrence of ignition even if ignition does not actually happen (that is, the igniter malfunctions). A similar problem may occur when the pad 601 deteriorates due to the expansion and shrinkage of the sealing resin, whereby the resistance value of the pad 601 is affected.

The illustrated igniter 100 may suffer a further problem. If noise is superimposed on the circuitry of the igniter 100, it may disturb the out put of the ignition confirmation signal IGF. Specifically, one path from the low potential side of the current detection resistor 12 to the non-inverting input terminal of the first comparator is different in length from the other path from the same low potential side to the inverting input terminal of the first comparator, and accordingly the impedances along the respective paths are mutually different. In addition, the parasitic capacitance present in the semiconductor substrate integrated with the control circuit 13 and that of the ignition coil may affect the impedances. As a result, the noises inputted to the non-inverting input terminal and the inverting input terminal may have a difference of phase. When the phase of the noise is different between at the non-inverting input terminal and at the inverting input terminal, the comparator may deteriorate in judging ability (and hence reliability of judgement) due to the fluctuation of the reference voltage (Vref1). In this case, the overdrive voltage necessary for switching the output logic of the comparator becomes higher, which can be equated with the rising of the reference voltage (Vref1), as illustrated in FIGS. 14A-14B. Accordingly, the reference voltage and the detection voltage Vcs are not correctly compared. This also applies to the second comparator.

Specifically, FIGS. 14A and 14B are diagrams for explaining the drawbacks in the operation of the igniter 100. FIG. 14A shows a case where no noise is superimposed. As shown in the figure, while the ignition instruction signal IGT is at a high level, the drive unit 133 causes the switch element 11 to be turned on. Thus, the current Ic flowing through the switch element 11 increases (the detection voltage Vcs also rises). The ignition confirmation signal IGF becomes high level when the detection voltage Vcs is lower than the reference voltage Vref1 and becomes low level when the detection voltage Vcs becomes higher than the reference voltage Vref1. Then, the ignition confirmation signal IGF becomes high level when the detection voltage Vcs becomes higher than the reference voltage Vref2.

FIG. 14B shows a case where noise is superimposed. As shown in the figure, the overdrive voltage increases due to the phase difference of the noise, and the reference voltages Vref1 and Vref2 are higher. In FIG. 14B, the ignition confirmation signal IGF is at a low level only during the period in which the detection voltage Vcs is between the reference voltage Vref1 and the reference voltage Vref2, as with the case of FIG. 14A. However, since the reference voltages Vref1, Vref2 are higher, the pulse of the ignition confirmation signal IGF is shifted to the right (solid lines) than the case where no noise is superimposed (broken lines). As other possible adverse cases, the pulse may shift to the left, or the pulse width may change, or even no pulse may be generated when one should be expected.

SUMMARY

The present disclosure has been proposed under the circumstances described above. It is therefore an object thereof to provide an igniter capable of suppressing a malfunction even when a defect occurs in a joint or bonding portion between a wire and a pad or in a pad itself. Further, another object is to provide an igniter capable of suppressing noise disturbance on the ignition confirmation signal.

According to a first aspect of the present disclosure, there is provided an igniter including: a switch element provided with an input electrode, an output electrode and a control electrode; a first lead held in contact with the input electrode of the switch element and electrically connected to a primary coil of an ignition coil; a second lead that is grounded; a third lead spaced apart from the first lead and the second lead; a first bonding wire connecting the output electrode and the third lead to each other; a second bonding wire connecting the third lead and the second lead to each other; and a control IC that drives the switch element based on an ignition instruction signal from an engine control unit and that generates an ignition confirmation signal based on a voltage of the third lead, the ignition confirmation signal being outputted to the engine control unit.

According to a second aspect of the present disclosure, there is provided a vehicle including: an igniter of the first aspect; an ignition plug; an ignition coil provided with a primary coil connected to the first lead and a secondary coil connected to the ignition plug; and an engine control unit that generates an ignition instruction signal and outputs said signal to the igniter.

According to a third aspect of the present disclosure, there is provided an igniter including: an output terminal connected to a primary coil of an ignition coil; a ground terminal that is grounded; a switch element connected between the output terminal and the ground terminal; a current detection resistor connected between the switch element and the ground terminal; an input terminal to which an ignition instruction signal from an engine control unit is inputted; and a control circuit that drives the switch element based on the ignition instruction signal. The control circuit may include: a reference voltage resistor including a terminal connected to a low potential terminal of the current detection resistor, where the reference voltage resistor produces a reference voltage; a comparator including a detection voltage input terminal, a reference voltage input terminal and a comparison result output terminal, where the detection voltage input terminal is connected to a high potential terminal of the current detection resistor, the reference voltage input terminal is connected to another terminal of the reference voltage resistor, and the comparison result output terminal outputs a comparison result signal generated in accordance with comparison between a voltage inputted to the detection voltage input terminal and a voltage inputted to the reference voltage input terminal; and a capacitor connected between the detection voltage input terminal and the reference voltage input terminal. Further, the control circuit may generate an ignition confirmation signal to be outputted to the engine control unit based on the comparison result signal.

According to a fourth aspect of the present disclosure, there is provided a vehicle including: an igniter of the third aspect; an ignition plug; an ignition coil including a primary coil connected to the output terminal and a secondary coil connected to the ignition plug; and an engine control unit that generates the ignition instruction signal and outputs the ignition instruction signal to the igniter.

Other features and advantages of the present disclosure will become more apparent from the detailed description given below with reference to the accompanying drawings.

BRIEF DESCRIPTION OF DRAWINGS

FIG. 10 shows a modified example of the layout of the function IC.

DETAILED DESCRIPTION OF EMBODIMENTS

Figure 1:
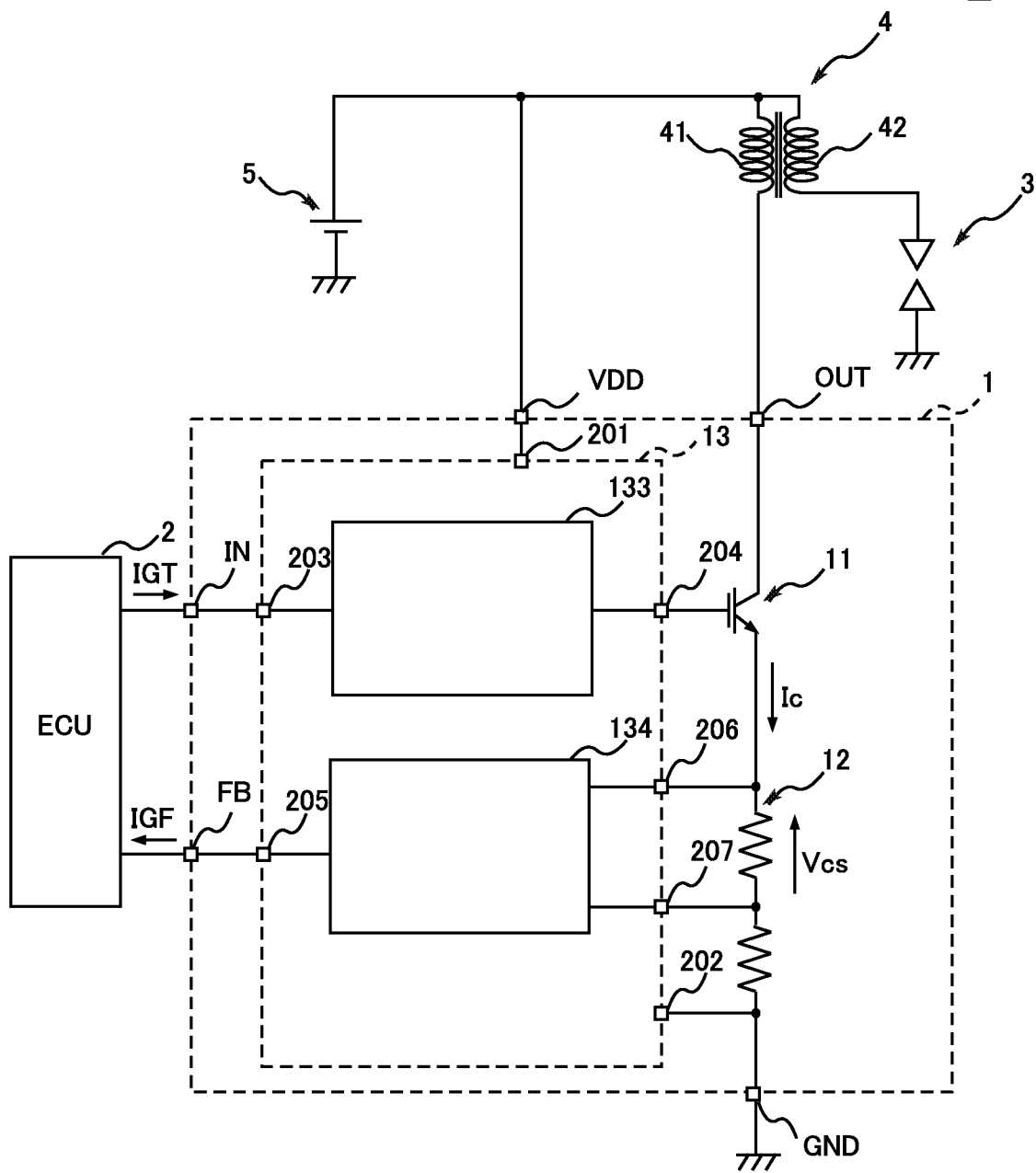
FIG. 1 is a block diagram for explaining an igniter according to a first embodiment.

Hereinafter, preferred embodiments of the present disclosure will be described in detail with reference to the drawings.

FIGS. 1 to 6 show an igniter according to a first embodiment. The illustrated igniter 1 is installed in a vehicle A. The vehicle A may be provided with, for example, an ECU (engine control unit) 2, a spark plug 3, an ignition coil 4, and a battery 5.

The ECU 2 is an electronic unit for controlling the operations of the engine, and is implemented by a microcomputer including a CPU and a memory, for example. The ECU 2 generates an ignition instruction signal IGT that defines the ignition timing of the spark plug 3. The ECU 2 outputs an ignition instruction signal IGT to the igniter 1.

The ignition coil 4 generates a high voltage for discharging the spark plug 3. The ignition coil 4 includes two coils such as a primary coil 41 and a secondary coil 42. One terminal of the primary coil 41 is connected to the battery 5 and the other terminal is connected to the output terminal OUT of the igniter 1. One terminal of the secondary coil 42 is connected to the battery 5 and the other terminal is connected to the spark plug 3.

The igniter 1 controls the operations (e.g., discharge) of the spark plug 3 based on an ignition instruction signal IGT inputted from the ECU 2. Specifically, the igniter 1 controls the current Ic flowing through the primary coil 41 of the ignition coil 4 based on the ignition instruction signal IGT. The igniter 1 causes the current Ic to flow through the primary coil 41 while the ignition instruction signal IGT is at a high level. The igniter 1 interrupts the current Ic flowing through the primary coil 41 at a timing when the ignition instruction signal IGT switches from the high level to a low level. As a result, a counter electromotive force of several hundred volts is generated in the primary coil 41. At this time, a high voltage of, for example, several tens of kV is generated in the secondary coil 42. This high voltage is applied to the ignition plug 3.

The igniter 1 includes a power supply terminal VDD, a ground terminal GND, an input terminal IN, an output terminal OUT, and a feedback terminal FB. The power supply terminal VDD is connected to the battery 5. The input terminal IN is connected to the ECU 2 and receives an ignition instruction signal IGT from the ECU 2. The output terminal OUT is connected to the primary coil 41 of the ignition coil 4. The feedback terminal FB is connected to the ECU 2 and outputs an ignition confirmation signal IGF to the ECU 2. The igniter 1 includes a switch element 11, a current detection resistor 12, and a control circuit 13. In the igniter 1, the switch element 11, the current detection resistor 12, and the control circuit 13 are collectively packaged.

The switch element 11 may be an IGBT, for example, and is turned on and off by the control circuit 13. The collector terminal of the switch element 11 is connected to the primary coil 41 of the ignition coil 4 via the output terminal OUT. The emitter terminal of the switch element 11 is grounded via the ground terminal GND. The gate terminal of the switch element 11 is connected to the control circuit 13. The switch element 11 is turned on and off in accordance with a gate drive signal inputted to the gate terminal from the control circuit 13. The switch element 11 is not limited to the IGBT, but may be another switch element such as a MOSFET (Metal-Oxide-Semiconductor Field-Effect Transistor).

The current detection resistor 12 is connected between the emitter terminal of the switch element 11 and the ground terminal GND. In FIG. 1, there is another resistor depicted to be connected to the ground-side terminal of the resistor 12, and this is a parasitic resistance of the lead 402 (described later). When the switch element 11 is in the On-state, a current Ic (a current flowing through the primary coil 41 of the ignition coil 4) flows through the current detection resistor 12. Thus, a voltage Vcs proportional to the current Ic is generated between the terminals of the current detection resistor 12. The resistance value of the current detection resistor 12 is, for example, about several mΩ to several tens of mΩ. Therefore, even if the current Ic is high (e.g., several amperes or more), the voltage Vcs can be suppressed to several mV to several hundred mV, for example. In the present embodiment, the current detection resistor 12 is a resistance component of the bonding wire arranged in the current path between the emitter terminal of the switch element 11 and the ground terminal GND. The current detection resistor 12 may be a chip-type resistor or, as described below, a resistor integrated in a function IC of the control circuit 13.

The control circuit 13 is a function IC integrated in a semiconductor substrate. The control circuit 13 controls the switch element 11 based on the ignition instruction signal IGT. The control circuit 13 monitors the current Ic flowing through the primary coil 41, generates an ignition confirmation signal IGF, and outputs it to the ECU 2. The control circuit 13 has a current limiting function of limiting the current Ic up to a predetermined upper limit. Further, the control circuit 13 has a timer protection function for forcibly turning off the switch element 11 in a certain situation. For example, when a predetermined period (standby period: 100 ms, for example) elapses while the ignition instruction signal IGT is on, the control circuit 13 may turn off the switch element 11.

The control circuit 13 includes a power supply pad 201, a ground pad 202, an input pad 203, a gate output pad 204, a feedback output pad 205, a sense input pad 206, and a sense ground pad 207. The power supply pad 201 is connected to the power supply terminal VDD, and the ground pad 202 is connected to the ground terminal GND. The input pad 203 is connected to the input terminal IN, and the gate output pad 204 is connected to the gate terminal of the switch element 11. The feedback output pad 205 is connected to the feedback terminal FB. The sense input pad 206 is connected to the high potential terminal of the current detection resistor 12. The sense ground pad 207 is connected to the low potential terminal of the current detection resistor 12. The control circuit 13 includes a drive unit 133 and an ignition confirmation unit 134.

The drive unit 133 controls the switch element 11. The drive unit 133 controls the voltage of the gate terminal of the switch element 11 according to the ignition instruction signal IGT. As a result, the On/Off-state of the switch element 11 is controlled. The drive unit 133 may include a high-frequency filter, a comparator, a delay circuit, and a driver. The high frequency filter removes high frequency noise from the ignition designation signal IGT and outputs the noiseless signal to the comparator. The comparator compares the ignition designation signal IGT with a threshold value and determines the level (high level or low level, for example). The comparator outputs the determination result (determination signal) to the delay circuit. The delay circuit gives a predetermined delay to the determination signal and outputs the signal to the driver. The driver generates and outputs a gate drive signal for driving the switch element 11 based on the determination signal. During a period in which the ignition instruction signal IGT is at a high level, the drive unit 133 turns on the switch element 11, and turns off the switch element 11 while the ignition instruction signal IGT is at a low level. When the ignition instruction signal IGT switches from the high level to the low level, the switch element 11 is switched from on to off. As a result, a high voltage is generated in the secondary coil 42 of the ignition coil 4, and the high voltage is applied to the ignition plug 3.

The ignition confirmation unit 134 generates an ignition confirmation signal IGF based on the current Ic flowing through the primary coil 41 and outputs it to the ECU 2. The ignition confirmation unit 134 generates the ignition confirmation signal IGF by comparing the current Ic (or the voltage corresponding thereto) with the reference currents Iref1, Iref2 (or voltages corresponding thereto), where Iref2>Iref1. Specifically, the ignition confirmation unit 134 generates the ignition confirmation signal IGF by comparing the terminal voltage Vcs of the current detection resistor 12 with the reference voltage Vref1 and the reference voltage Vref2 (>Vref1). The ignition confirmation unit 134 generates an ignition confirmation signal IGF, which becomes a first level (e.g., low level) when the detection voltage Vcs is a voltage between the reference voltage Vref1 and the reference voltage Vref2 (Vref1<Vc<Vref2). The signal IGF becomes a second level (e.g., high level) when in other cases (Vc<Vref1, Vref2<Vc). The generated ignition confirmation signal IGF is outputted to the ECU 2. Alternatively, the first level may be a high level and the second level may be a low level.

Figure 2:
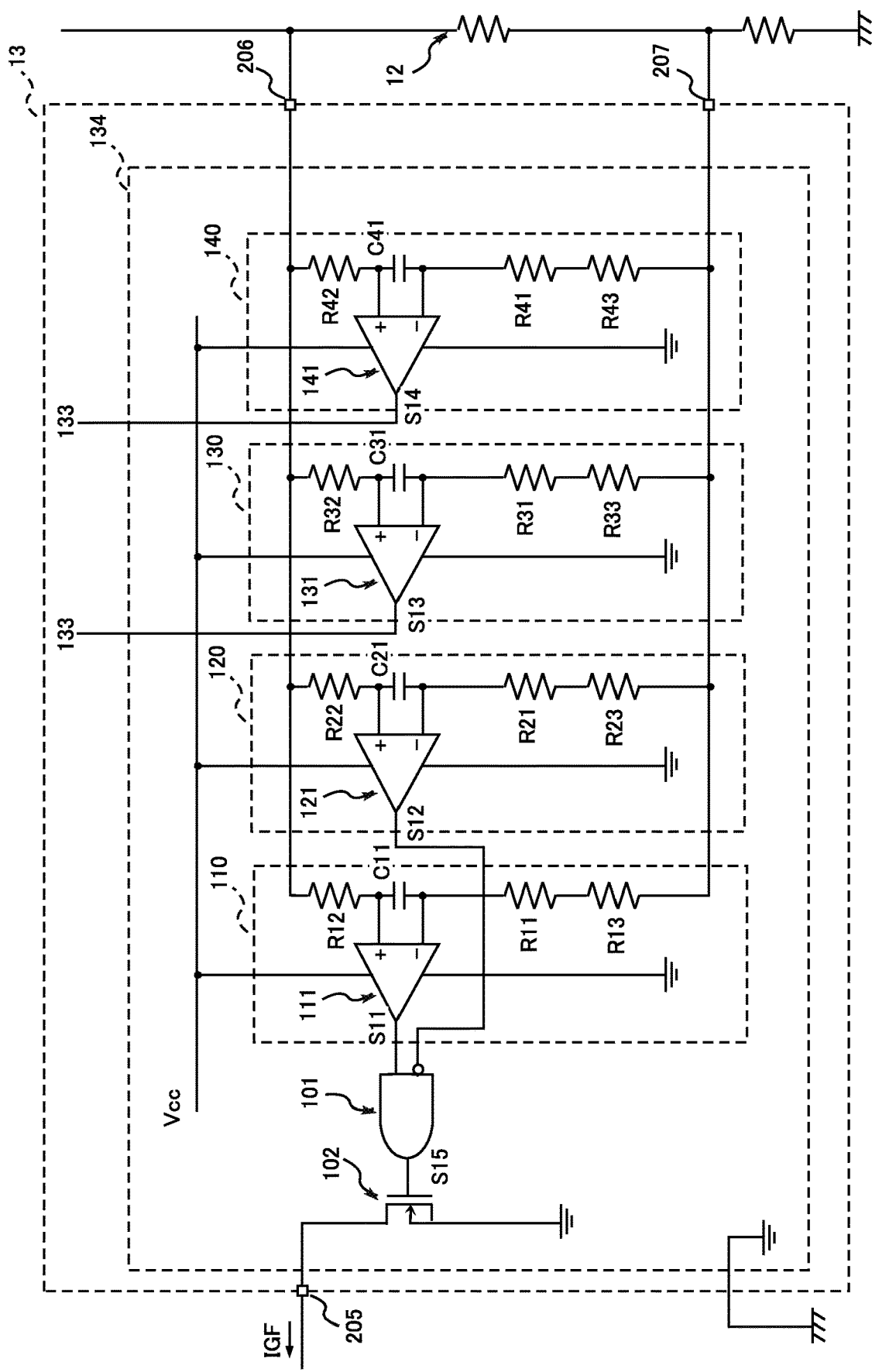
FIG. 2 is a circuit diagram for explaining the ignition confirmation unit of the igniter of FIG. 1.

FIG. 2 is a circuit diagram showing details of the ignition confirmation unit 134. The ignition confirmation unit 134 includes a first comparison unit (or section) 110, a second comparison unit (or section) 120, a third comparison unit (or section) 130, a fourth comparison unit (or section) 140, a logic operation unit 101, and an output transistor 102.

The first comparison unit 110 compares the detection voltage Vcs with the reference voltage Vref1. The first comparison unit 110 includes a comparator 111, a resistor R11, a capacitor C11, and resistors R12 and R13. The resistor R11 is a resistor for setting the reference voltage Vref1. The comparator 111 compares the detection voltage Vcs with the reference voltage Vref1. The non-inverting input terminal of the comparator 111 is connected to the sense input pad 206. The inverting input terminal of the comparator 111 is connected to the sense ground pad 207 via the resistor R11. The output terminal of the comparator 111 is connected to the logic operation unit 101, and outputs the result of comparison between the detection voltage Vcs and the reference voltage Vref1. The comparator 111 outputs a comparison signal S11 which becomes high level when the detection voltage Vcs is larger than the reference voltage Vref1 (Vcs>Vref1) and becomes low level when the detection voltage Vcs is smaller than the reference voltage Vref1 (Vcs<Vref1).

Figure 3:
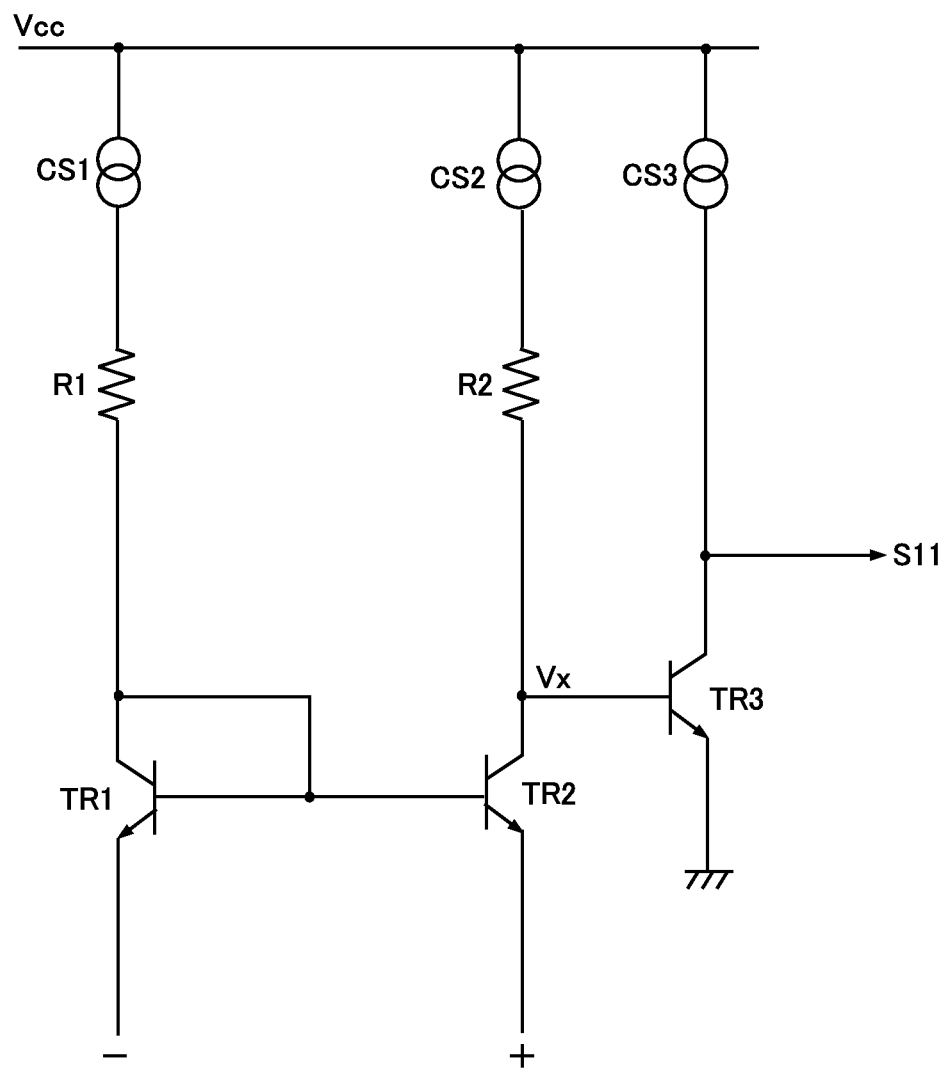
FIG. 3 is a circuit diagram illustrating a comparator.

FIG. 3 is a circuit diagram showing a configuration example of the comparator 111. The comparator 111 includes a transistor TR1, a transistor TR2, a transistor TR3, a current source CS1, a current source CS2, a current source CS3, a resistor R1, and a resistor R2.

Transistor TR1 and transistor TR2 are NPN bipolar transistors. The collector terminal of the transistor TR1 is connected to the current source CS1 via the resistor R1. The collector terminal of the transistor TR2 is connected to the current source CS2 via the resistor R2. The base terminal of the transistor TR1 and the base terminal of the transistor TR2 are connected to the collector terminal of the transistor TR1. The emitter terminal of the transistor TR1 is connected to the inverting input terminal(−). The emitter terminal of the transistor TR2 is connected to the non-inverting input terminal(+). The transistor TR1 and the transistor TR2 constitute a differential input section of the comparator 111. The emitter voltage of the transistor TR1 is compared with the emitter voltage of the transistor TR2, and the collector voltage Vx of the transistor TR2 changes in accordance with the magnitude relation (i.e., which is greater or smaller, etc.) between the reference voltage Vref1 and the detection voltage Vcs.

The current source CS3 and the transistor TR3 constitute an emitter follower type output stage. The collector terminal of the transistor TR3 is connected to the current source CS3, the base terminal is connected to the collector terminal of the transistor TR2, and the emitter terminal is grounded. The transistor TR3 outputs the comparison signal S11 from the collector terminal according to the collector voltage Vx of the transistor TR2.

The capacitor C11 is connected between the non-inverting input terminal and the inverting input terminal of the comparator 111. The capacitance of the capacitor C11 is, for example, 0.1 to 100 pF. By smoothing the voltage between the terminals, the capacitor C11 can suppress the phase difference between the voltage (voltage Vcs on which noise is superimposed) inputted to the non-inverting input terminal and the voltage (reference voltage Vref1 on which noise is superimposed) inputted to the inverting input terminal.

The resistor R12 has two terminals. One terminal is connected to the non-inverting input terminal of the comparator 111, and the other terminal is connected to the sense input pad 206. One terminal of the resistor R13 is connected to the resistor R11 and the other terminal is connected to the sense ground pad 207. In the resistor R13, one terminal may be connected to the inverting input terminal of the comparator 111 and the other terminal may be connected to the resistor R11. The resistance value of the resistor R12 is approximately the same as the resistance value of R13, and it is, for example, 100Ω to 10 kΩ. The resistor R12 and the capacitor C11 constitute an RC filter for removing high frequency inputted to the non-inverting input terminal of the comparator 111. The resistor R13 and the capacitor C11 constitute an RC filter for removing the high frequency inputted to the inverting input terminal of the comparator 111. The capacitor C11 and the resistors R12, R13 remove the high frequency noise inputted to the respective input terminals of the comparator 111. The cutoff frequency of the RC filter constituted by the capacitor C11 and the resistors R12, R13 is higher than the frequency component (several tens to several hundreds Hz) of the detection voltage Vcs during normal operation, and lower than the frequency of the noise to be eliminated (1 MHz with radio reception failure BCI). Therefore, the cutoff frequency may preferably be several hundred Hz to several tens of kHz. Since the resistance value of the resistor R12 is approximately the same as the resistance value of R13, the voltage drop due to the resistor R12 and the voltage drop by the resistor R13 are about the same. Therefore, by comparing the voltage inputted to the non-inverting input terminal and the voltage inputted to the inverting input terminal, it is possible to compare the detection voltage Vcs and the reference voltage Vref1.

The second comparison unit 120 compares the detection voltage Vcs with the reference voltage Vref2. The second comparison unit 120 includes a comparator 121, a resistor R21, a capacitor C21, and resistors R22 and 23. The resistor R21 is a resistor for setting the reference voltage Vref2. The comparator 121 compares the detection voltage Vcs with the reference voltage Vref2. The non-inverting input terminal of the comparator 121 is connected to the sense input pad 206. The inverting input terminal of the comparator 121 is connected to the sense ground pad 207 via the resistor R21. An output terminal of the comparator 121 is connected to the logic operation unit 101, and outputs a comparison result between the detection voltage Vcs and the reference voltage Vref2. The comparator 121 outputs a comparison signal S12, which becomes a high level when the detection voltage Vcs is larger than the reference voltage Vref1 (Vcs>Vref2), and which becomes a low level when the detection voltage Vcs is smaller than the reference voltage Vref2 (Vcs<Vref2).

The capacitor C21 is connected between the non-inverting input terminal and the inverting input terminal of the comparator 121. The capacitor C21 is a capacitor similar to the capacitor C11 of the first comparison unit 110. In the resistor R22, one terminal is connected to the non-inverting input terminal of the comparator 121 and the other terminal is connected to the sense input pad 206. In the resistor R23, one terminal is connected to the resistor R21, and the other terminal is connected to the sense ground pad 207. In the resistor R23, one terminal may be connected to the inverting input terminal of the comparator 121, while the other terminal may be connected to the resistor R21. The resistance value of the resistance R22 and the resistance value of R23 are about the same. The resistors R22 and R23 are resistors similar to the resistors R12 and R13 of the first comparator 110.

The logical operation unit 101 performs a logical operation based on the comparison signal S11 from the first comparison unit 110 and the comparison signal S12 from the second comparison unit 120. The logic operation unit 101 outputs a signal S15 indicating the operation result. The logical operation unit 101 calculates the logical product of the comparison signal S11 and the inverted signal of the comparison signal S12. When the comparison signal S11 and the comparison signal S12 are both at the low level (Vcs<Vref1), the operation result signal S15 is at the low level. When the comparison signal S11 is at the high level and the comparison signal S12 is at the low level (Vref1<Vcs<Vref2), the operation result signal S15 is at the high level. When the comparison signal S11 and the comparison signal S12 are both at the high level (Vcs>Vref2), the operation result signal S15 is at the low level. That is, the operation result signal S15 becomes high level only during the period when the comparison signal S11 is at the high level and the comparison signal S12 is at the low level (Vref1<Vcs<Vref2).

The output transistor 102 is an open drain (open collector) type transistor, and in the present embodiment, it is an N channel MOSFET. The drain terminal of the output transistor 102 is connected to the feedback terminal FB via the feedback output pad 205. The source terminal of the output transistor 102 is grounded. To the gate terminal of the output transistor 102, the operation result signal S15 is inputted from the logic operation unit 101. When the operation result signal S15 is at the high level, the ignition confirmation signal IGF becomes the low level. When the operation result signal S15 is low level, the ignition confirmation signal IGF becomes high level. The feedback terminal FB is connected to the ECU 2. Based on the ignition confirmation signal IGF inputted via the feedback terminal FB, the ECU 2 detects whether or not the igniter 1 is operating normally.

The third comparison unit 130 compares the current Ic with the first upper limit current Iref3 (>Iref2). Based on this comparison, the third comparison unit 130 detects that the current Ic has reached the first upper limit current Iref3. Specifically, the third comparison unit 130 compares the detected voltage Vcs with the reference voltage Vref3 (>Vref2) corresponding to the first upper limit current Iref3. The third comparison unit 130 includes a comparator 131, a resistor R31, a capacitor C31, and resistors R32 and R33. The resistor R31 is a resistor for setting the reference voltage Vref3. The comparator 131 compares the detection voltage Vcs with the reference voltage Vref3. The non-inverting input terminal of the comparator 131 is connected to the sense input pad 206. The inverting input terminal of the comparator 131 is connected to the sense ground pad 207 via the resistor R31. The output terminal of the comparator 131 is connected to a current limiting unit of the drive unit 133, and outputs the comparison result between the detection voltage Vcs and the reference voltage Vref3. The comparator 131 outputs the comparison signal S13, which becomes high level when the detection voltage Vcs is larger than the reference voltage Vref3 (Vcs>Vref3), and becomes low level when the detection voltage Vcs is smaller than the reference voltage Vref3 (Vcs<Vref3).

The capacitor C31 is connected between the non-inverting input terminal and the inverting input terminal of the comparator 131. The capacitor C31 is a capacitor similar to the capacitor C11 of the first comparison unit 110. In the resistor R32, one terminal is connected to the non-inverting input terminal of the comparator 131 and the other terminal is connected to the sense input pad 206. In resistor R33, one terminal is connected to resistor R31 and the other terminal is connected to sense ground pad 207. In the resistor R33, one terminal may be connected to the inverting input terminal of the comparator 131, and the other terminal may be connected to the resistor R31. The resistance value of the resistor R32 and the resistance value of R33 are about the same. The resistors R32 and R33 are resistors similar to the resistors R12 and R13 of the first comparator 110.

The fourth comparison unit 140 compares the current Ic with the second upper limit current Iref4 (<Iref3), thereby detecting that the current Ic has reached the second upper limit current Iref4. Specifically, the fourth comparison unit 140 compares the detection voltage Vcs with the reference voltage Vref4 (<Vref3) corresponding to the second upper limit current Iref4. The fourth comparison unit 140 includes a comparator 141, a resistor R41, a capacitor C41, and resistors R42 and R43. The resistor R41 is a resistor for setting the reference voltage Vref4. The comparator 141 compares the detection voltage Vcs with the reference voltage Vref4. The non-inverting input terminal of the comparator 141 is connected to the sense input pad 206. The inverting input terminal of the comparator 141 is connected to the sense ground pad 207 via the resistor R41. The output terminal of the comparator 141 is connected to the current limiting unit of the drive unit 133, and outputs the comparison result between the detection voltage Vcs and the reference voltage Vref4. The comparator 141 outputs the comparison signal S14, which becomes a high level when the detection voltage Vcs is larger than the reference voltage Vref4 (Vcs>Vref4), and becomes a low level when the detection voltage Vcs is smaller than the reference voltage Vref4 (Vcs<Vref4).

The capacitor C41 is connected between the non-inverting input terminal and the inverting input terminal of the comparator 141. The capacitor C41 is a capacitor similar to the capacitor C11 of the first comparison unit 110. In the resistor R42, one terminal is connected to the non-inverting input terminal of the comparator 141, and the other terminal is connected to the sense input pad 206. In the resistor R43, one terminal is connected to the resistor R41 and the other terminal is connected to the sense ground pad 207. In the resistor R43, one terminal may be connected to the inverting input terminal of the comparator 141 and the other terminal may be connected to the resistor R41. The resistance value of the resistance R42 is approximately equal to the resistance value of R43. The resistors R42 and R43 are resistors similar to the resistors R12 and R13 of the first comparator 110, respectively.

Based on the comparison signal S13 from the third comparison unit 130 and the comparison signal S14 from the fourth comparison unit 140, the current limiting section of the drive unit 133 limits the voltage, during the On-period, of the gate terminal of the switch element 11. As a result, the current Ic flowing through the switch element 11 is limited. When the comparison signal S13 is at the high level, the voltage during the On-period of the gate terminal of the switch element 11 is limited, so that the current Ic is limited to the first upper limit current Iref3. Further, when the On-state of the switch element 11 continues for a predetermined time, the current limiting section limits the voltage during the On-state of the gate terminal of the switch element 11, based on the comparison signal S14 (i.e., when the comparison signal S14 is at the high level). Thus, the current Ic is limited to the second upper limit current Iref4.

The ignition confirmation unit 134 may include an additional comparison unit besides the first to the fourth comparison units. The additional comparator may compare the detected voltage Vcs with a predetermined additional reference voltage (compares the current Ic flowing through the switch element 11 with a predetermined additional reference current). Based on the comparison result, the control circuit 13 may perform an additional control.

Figure 4:
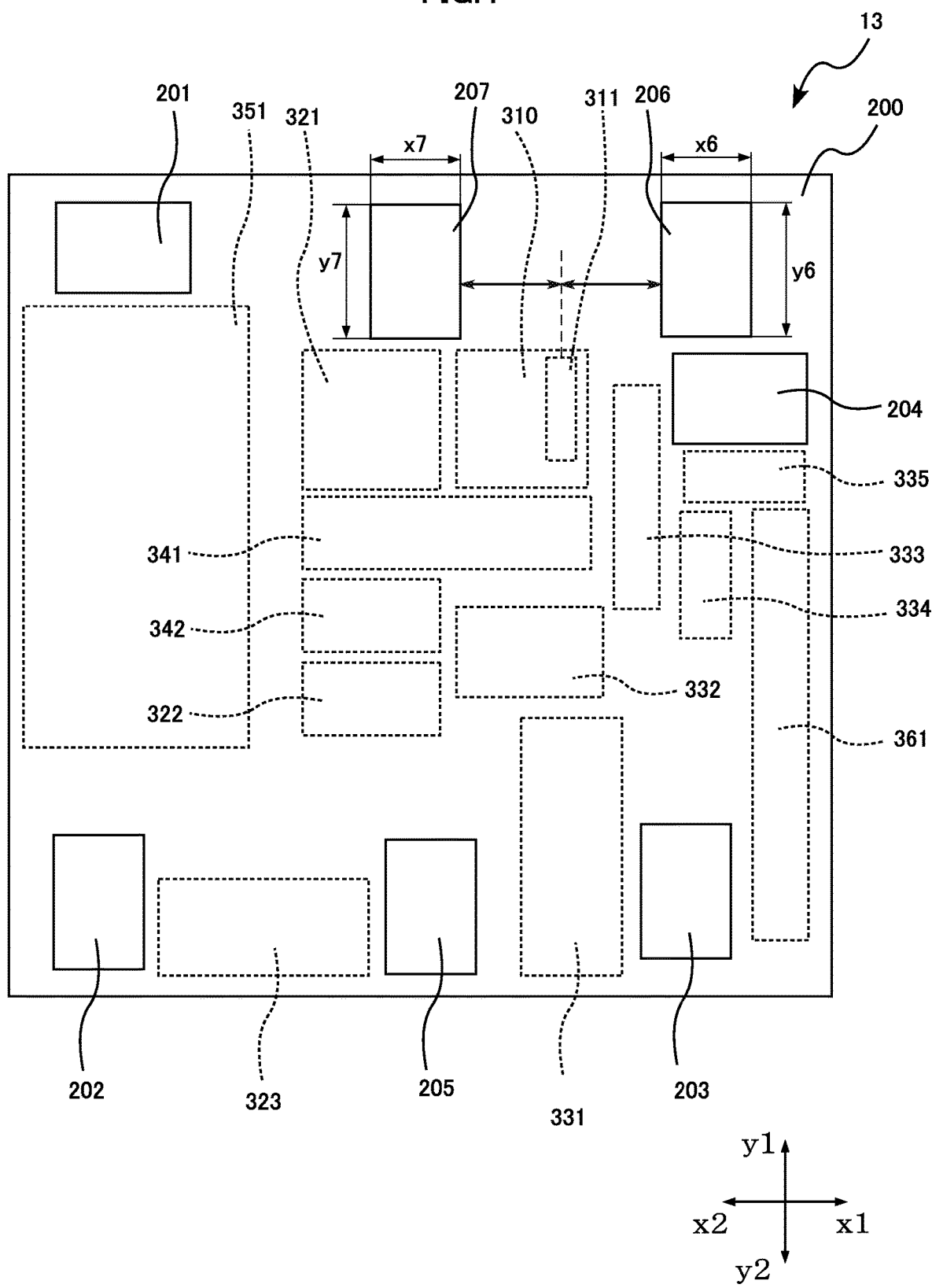
FIG. 4 is a plan view showing an example of the layout of the function IC of the control circuit of the igniter of FIG. 1.

FIG. 4 is a plan view showing an example of the layout of the function IC of the control circuit 13. The control circuit 13 includes a semiconductor substrate 200. The control circuit 13 also includes a power supply pad 201, a ground pad 202, an input pad 203, a gate output pad 204, a feedback output pad 205, a sense input pad 206, and a sense ground pad 207, all of which are formed on the semiconductor substrate 200. The functional elements constituting the drive unit 133 and the ignition confirmation unit 134 of the control circuit 13 are formed in the semiconductor substrate 200. In FIG. 4, the thickness direction of the semiconductor substrate 200 corresponds to the z direction.

The power supply pad 201, the sense input pad 206 and the sense ground pad 207 are disposed at the end portion in the y1 direction of the semiconductor substrate 200. The power supply pad 201 is arranged at the end portion in the x2 direction, and its dimension in the x direction is longer than that in the y direction. In other words, the pad 201 is elongated horizontally (in the x direction) in FIG. 4. The sense input pad 206 is arranged in the vicinity of the end portion in the x1 direction, and the dimension y6 in the y direction is longer than the dimension x6 in the x direction. The sense ground pad 207 is arranged near or at the center in the x direction, and the dimension y7 in the y direction is longer than the dimension x7 in the x direction. The ground pad 202, the input pad 203, and the feedback output pad 205 are disposed at the end portion in the y2 direction of the semiconductor substrate 200. The ground pad 202 is disposed at the end in the x 2 direction, and the dimension in the y direction is longer than the dimension in the x direction. The input pad 203 is arranged in the vicinity of the end portion in the x1 direction, and the dimension in the y direction is longer than the dimension in the x direction. The feedback output pad 205 is disposed near or at the center in the x direction, and the dimension in the y direction is longer than the dimension in the x direction. The gate output pad 204 is disposed at the end of the sense input pad 206 on the y2 side in the x1 direction, and the dimension in the x direction is longer than the dimension in the y direction. Each pad 201 to 207 has a shape conformed to the wire bonding direction.

The semiconductor substrate 200 of the control circuit 13 includes a plurality of regions 310, 321, 322, 323, 331, 332, 333, 334, 335, 341, 342, 351, 361.

The region 310 is formed with functional elements constituting the first comparison unit 110, the second comparison unit 120, the third comparison unit 130, and the fourth comparison unit 140. The region 310 is located near the sense input pad 206 and the sense ground pad 207. The region 310 is located between the sense input pad 206 and the sense ground pad 207 in the x direction. The region 310 is adjacent to the sense input pad 206 and the sense ground pad 207 in the y direction. The entirety of the region 310 is disposed offset toward the sense input pad 206 (or the sense ground pad 207 or the both) from the center of semiconductor substrate 200 in the y direction. As described above, the region 310 is located near the sense input pad 206 and the sense ground pad 207. Thus, for example, in the first comparison unit 110, the wiring from the sense input pad 206 to the resistor R12 and the wiring from the sense ground pad 207 to the resistor R13 can be shortened. The same applies to the second comparison unit 120, the third comparison unit 130, and the fourth comparison unit 140.

Figure 5:
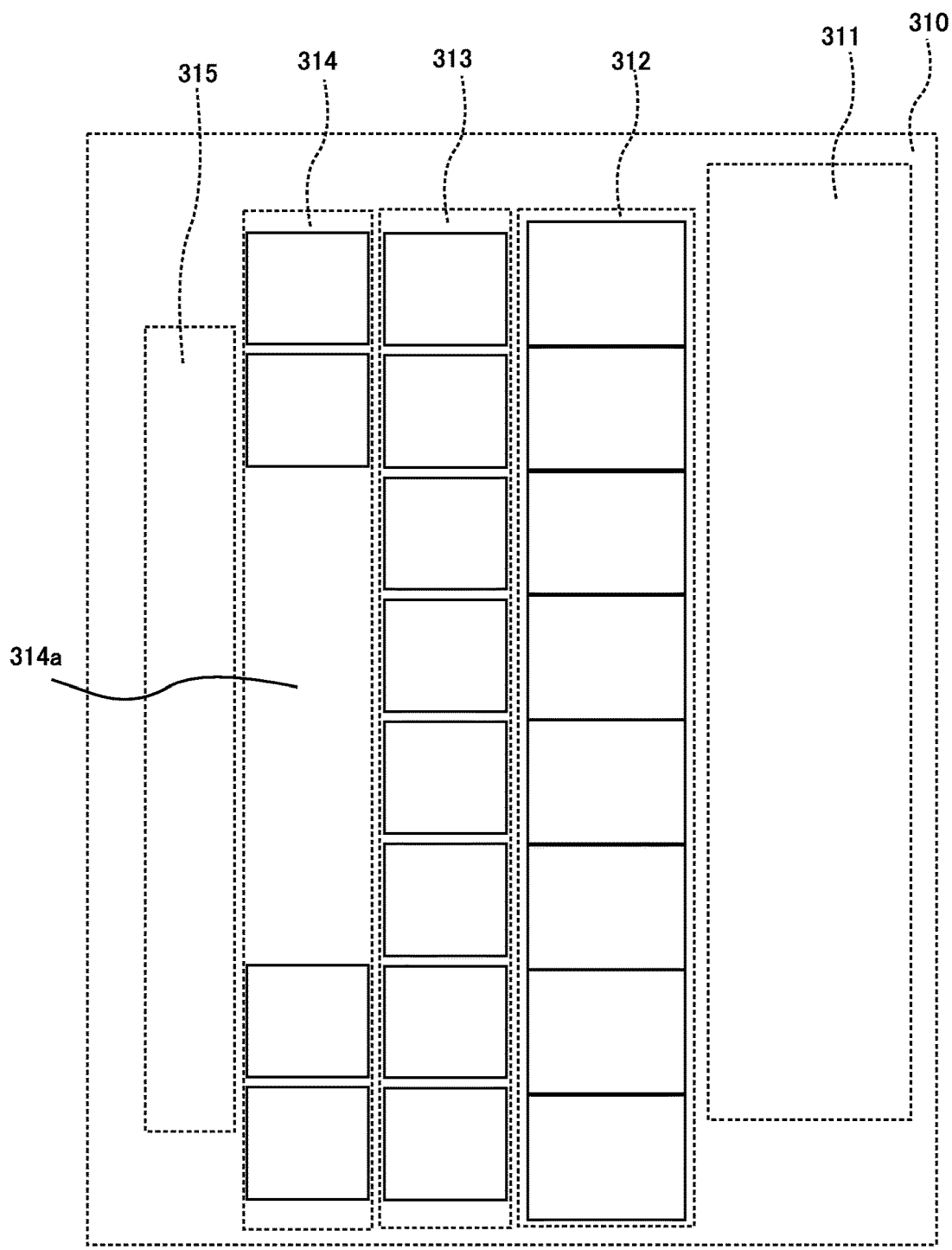
FIG. 5 is a plan view showing one of the regions shown in FIG. 4.

FIG. 5 is a plan view showing details of the region 310. The region 310 includes a plurality of regions (or sub regions). In the illustrated example, the region 310 includes five regions 311-315.

In the region 311, resistors R12, R13, R22, R23, R32, R33, R42, R43 are formed. The resistors R12 and R13 are disposed adjacent to each other, the resistors R22 and R23 are arranged adjacent to each other, the resistors R32 and R33 are arranged adjacent to each other, and the resistors R42 and R43 are arranged adjacent to each other. The region 311 is arranged in the end part in the x1 direction within the region 310. As shown in FIG. 4, the region 311 is located equidistant from the sense input pad 206 and the sense ground pad 207. Specifically, the center of the region 311 in the x direction is equidistant from the x2 direction edge of the sense input pad 206 and the x1 direction edge of the sense ground pad 207 in the x direction. Thus, for example, in the first comparison unit 110, the wiring from the sense input pad 206 to the resistor R12 and the wiring from the sense ground pad 207 to the resistor R13 can be about the same length. The same applies to the second comparison unit 120, the third comparison unit 130, and the fourth comparison unit 140.

In the region 312, capacitors C11, C21, C31, C41 are formed. The region 312 is disposed adjacent to the region 311 on the x2 direction side. In the example shown in the figure, each of the capacitors C11, C21, C31, C41 is formed by connecting two capacitors in parallel, and eight capacitors are provided in the region 312. Since the region 312 is adjacent to the region 311, for example in the first comparator 110, the wiring connecting the capacitor C11 and the resistor R12 can be shortened. In the case where the resistor R13 is disposed closer to the comparator 111 than the resistor R11, the wiring connecting the capacitor C11 and the resistor R13 can be shortened. The same applies to the second comparison unit 120, the third comparison unit 130, and the fourth comparison unit 140.

The region 313 is formed with a total of eight transistors included in the differential input sections of the respective comparators 111, 121, 131 and 141 (Note that each differential input section includes two transistors. See transistors TR1, TR2 in FIG. 3). The region 313 is disposed adjacent to the region 312 on the x2 direction side. Since the region 313 is adjacent to the region 312, for example, in the first comparison unit 110, the wiring connecting the comparator 111 and the capacitor C11 can be shortened. The same applies to the second comparison unit 120, the third comparison unit 130, and the fourth comparison unit 140. Further, the region 313 is arranged near the region 311. Thus, for example, in the first comparison unit 110, the wiring connecting the comparator 111 and the resistor R12 can be shortened. In addition, when the resistor R13 is disposed on the comparator 111 side of the resistor R11, the wiring connecting the comparator 111 and the resistor R13 can be shortened. The same applies to the second comparison unit 120, the third comparison unit 130, and the fourth comparison unit 140.

The region 314 is formed with four diodes, which are protection diodes each included in a corresponding one of the comparators 111, 121, 131, and 141. The region 314 is arranged adjacent to the region 313 on the x2 direction side. In the present embodiment, two diodes (in a first group) are formed at the end portion in the y1 direction of the region 314, and two diodes (in a second group) are formed at the end portion in the y2 direction. The region 314 includes a region 314a in which no functional elements are formed. In the illustrated example, the region 314a is elongated in the y1-y2 direction and disposed between the first and the second group of diodes in the y1-y2 direction.

The region 315 is formed with a plurality of resistances (see the resistances R1 and R2 in FIG. 3) included in the comparators 111, 121, 131, and 141. These resistors are provided to limit the surge current from the sense input pad 206 and the sense ground pad 207. The region 315 is arranged adjacent to the region 314 on the x2 direction side. The plurality of resistors in each of the comparators have mutually different resistance values and are connected in parallel with each other. Only one of these resistors is actually used, while the others are disabled to function by cutting the connections to them. Since no functional elements are formed in the region 314a as noted above, it is easy to perform the cutting.

The resistors R12, R13, R22, R23, R32, R33, R42, R43 formed in the region 311 generate heat by consuming noise. The first comparison unit 110, the second comparison unit 120, the third comparison unit 130, and the fourth comparison unit 140 formed in the area 310 are susceptible to external noise. In the present embodiment, in order to suppress the influence of heat and external noise on functional elements, the region 310 is arranged at a position as close as possible to the peripheral part on the semiconductor substrate 200. That is, the region 310 avoids a position (for example, a central position) surrounded by other regions on the semiconductor substrate 200.

Returning to FIG. 4, the region 321 is formed with the resistors R11, R21, R31, and R41 for setting a reference voltage for comparison with the detection voltage Vcs. These resistors have, for example, a configuration capable of adjusting the resistance value by laser trimming. The region 321 is arranged on the x2 direction side of the region 310. The region 322 is formed with some elements of the ignition confirmation unit 134, such as the logic operation unit 101 and the output transistor 102, for example. The region 323 is formed with a protection circuit for protecting the control circuit 13 from surge and noise inputted from the feedback output pad 205.

The region 331 is formed with a protection circuit for protecting the control circuit 13 from surge and noise inputted from the input pad 203. The region 332 is formed with some elements of the drive unit 133, such as the high-frequency filter, the comparator and the delay circuit, for example. The region 333 is formed with an oscillation circuit for generating an internal clock and a timer, for example. The region 334 is formed with a logic circuit. The region 335 is formed with a driver of the drive unit 133.

The region 341 is formed with an internal power source of the control circuit 13. The region 342 is formed with a circuit for generating the internal reference voltage of the control circuit 13. The region 351 is formed with a protection circuit for protecting the control circuit 13 from surge and noise inputted from the power supply pad 201 or the ground pad 202. The region 361 is formed with a test pad.

Figure 6:
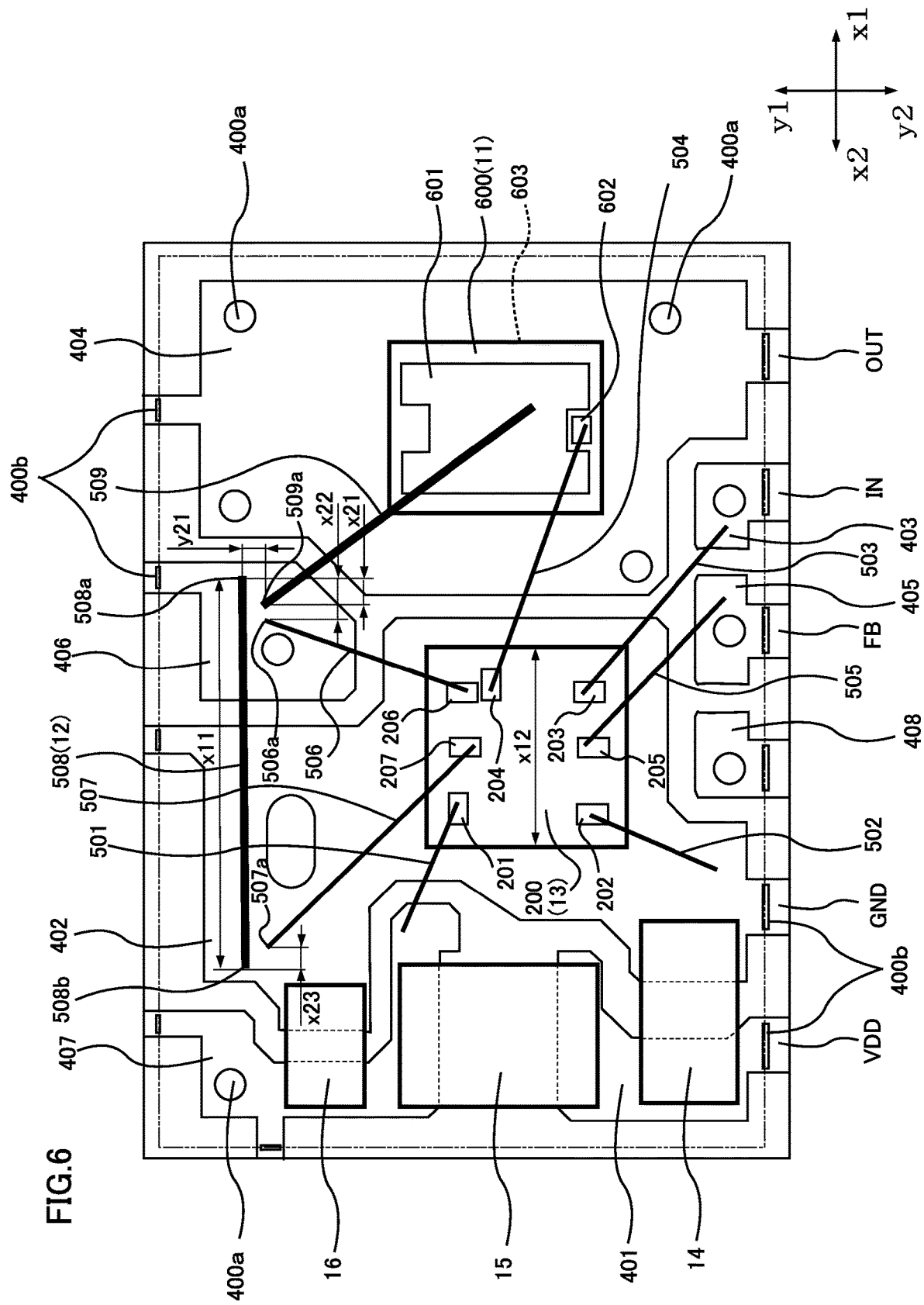
FIG. 6 is a plan view showing an example of the layout of the internal configuration of the igniter of FIG. 1.

FIG. 6 is a plan view showing an example of the layout of the internal configuration of the igniter 1. The igniter 1 is accommodated in a package and the resulting product may have a configuration of 6-pin SiP (Single In-Line Package), for example. FIG. 6 illustrates a sealing resin which may be made of a black epoxy resin by two-dot chain lines. The igniter 1 includes leads 401 to 408.

The lead 401 has a power supply terminal VDD and is disposed at the end in the y2 direction and at the end in the x2 direction of the package. The lead 407 is disposed on the y1 direction side of the lead 401, and located at the end in the y2 direction and at the end in the x 2 direction of the package. The lead 402 has a ground terminal GND and is disposed on the x1 direction side of the lead 401 and the lead 407. The lead 402 extends from the end in the y1 direction to the end in the y2 direction of the package. The lead 404 has an output terminal OUT and is disposed on the x1 direction side of the lead 402. The lead 404 is disposed at the end of the package in the x1 direction and extends from the end in the y1 direction to the end in the y2 direction of the package. The lead 406 is disposed at the end of the package in the y1 direction and is disposed between the lead 402 and the lead 404. The leads 403, 405, and 408 are arranged at the end in the y2 direction of the package, and are disposed between the lead 402 and the lead 404. The lead 403 has an input terminal IN and is adjacent to the lead 404. The lead 408 has an unused terminal and is adjacent to the lead 402. The lead 405 has a feedback terminal FB and is disposed between the lead 405 and the lead 408.

Each of the leads 402 to 408 is formed with a through-hole 400a extending in the thickness direction. When the sealing resin is formed, the through-holes 400a are filled with the sealing resin. Thus, it is possible to suppress the peeling of the sealing resin from the leads 402 to 408. In addition, each lead 401 to 408 is formed with a groove 400b. The respective grooves 400b are arranged along the boundary between the portions covered with the sealing resin and the portions not covered (see the two-dot chain lines in FIG. 6). In the manufacturing process of the igniter 1, a protective resin (for example, polyimide) for protecting the bonding portion between the bonding wire and the lead is applied before the sealing resin is formed. The grooves 400b are provided to prevent the applied protective resin from unduly flowing out.

The semiconductor substrate 200 with the control circuit 13 integrated is mounted on the lead 402. The power supply pad 201 is connected to the lead 407 by the bonding wire 501. The ground pad 202 is connected to the lead 402 (ground terminal GND) by the bonding wire 502. The input pad 203 is connected to the lead 403 (input terminal IN) by the bonding wire 503. The gate output pad 204 is connected to a pad 602 (described below) by the bonding wire 504. The feedback output pad 205 is connected to the lead 405 (feedback terminal FB) by the bonding wire 505. The sense input pad 206 is connected to the lead 406 by the bonding wire 506. The sense ground pad 207 is connected to the lead 402 by the bonding wire 507. The bonding wires 501 to 507 may be made of Al, for example. Alternatively, the bonding wires 501 to 507 may be made of other metals, such as Al alloy, Au and Cu, for example.

The switch element 11 is mounted on the lead 404. The switch element 11 includes a semiconductor substrate 600, pads 601 and 602, and a backside electrode 603. The semiconductor substrate 600 is a substrate including a p-type semiconductor layer and an n-type semiconductor layer for configuring the switch element 11. The pad 601 is an emitter electrode. The pad 602 is a gate electrode. The backside electrode 603 is a collector electrode. The pad 601 and the pad 602 are disposed on the front surface (obverse surface) of the semiconductor substrate 600. The backside electrode 603 is disposed on the back surface (reverse surface) of the semiconductor substrate 600. The semiconductor substrate 600 (switch element 11) is mounted so that the backside electrode 603 is in contact with the lead 404. Thus, the collector terminal of the switch element 11 is connected to the output terminal OUT. The pad 601 is connected to the lead 402 by the bonding wire 509, the lead 406 and the bonding wire 508. Thus, the emitter terminal of the switch element 11 is connected to the ground terminal GND. The pad 602 is connected to the gate output pad 204 by the bonding wire 504. A gate drive signal from the control circuit 13 is inputted to the gate terminal of the switch element 11.

The pad 601 is not directly connected to the lead 402 (ground terminal GND). Specifically, the pad 601 is connected to the lead 406 by the bonding wire 509, and the lead 406 is connected to the lead 402 (ground terminal GND) by the bonding wire 508, while also connected to the sense input pad 206 by the bonding wire 506. Thus, the resistance component of the bonding wire 508 corresponds to the current detection resistor 12.

The bonding wires 508, 509 may be made of Al, for example. Alternatively, the bonding wires 508, 509 may be made of other metals, such as Al alloy, Au and Cu, for example. The bonding wire 508 has a resistance component that is used for the current detection resistor 12. In order to improve the detection accuracy at the ignition confirmation unit 134, it is preferable to increase the resistance value of the current detection resistance 12. In order to increase the resistance value of the bonding wire 508, it is preferable to use Al. In addition, it is desirable that the bonding wire 508 should be as long as possible. Therefore, the bonding point 508a of the bonding wire 508 to the lead 406 is set to a position on the x1 direction side of the lead 406 as much as possible. In the illustrated example, the bonding point 508a is disposed on the x1 direction side by an amount x21 from the bonding point 509a of the bonding wire 509 to the lead 406, and also disposed on the x1 direction side by an amount X22 from the bonding point 506a of the bonding wire 506 to the lead 406. The bonding point 508b of the bonding wire 508 to the lead 402 is set to a position on the x2 direction side of the lead 402 as much as possible. In the present embodiment, the bonding point 508b is disposed on the x2 direction side by an amount x23 from the bonding point 507a of the bonding wire 507 to the lead 402. The dimension x11 of the bonding wire 508 in the x direction is larger than the dimension x12 of the semiconductor substrate 200 in the x direction. Further, the bonding point 508a is disposed on the y1 direction side from the bonding point 506a. The bonding point 508b is disposed on the y1 direction side from the bonding point 507a. The bonding point 508a is disposed on the y1 direction side by an amount y21 from the bonding point 509a. The height of the loop (maximum separation distance from the lead 402 in the z direction) may be increased in order to make the bonding wire 508 as long as possible. In the present embodiment, the height of the loop of the bonding wire 508 is larger than the height of the loop of the bonding wire 509 and the heights of the bonding wires 501 to 507.

A relatively large current flows through the bonding wires 508 and 509. Thus, it is desirable that the bonding wires 508, 509 are thicker or greater in diameter than the bonding wires 501-507. The bonding of the bonding wires 508 and 509 is performed after the bonding of the bonding wires 501 to 507.

The bonding point 506a of the bonding wire 506 is desirably as close as possible to the bonding point 508a of the bonding wire 508. Likewise, the bonding point 507a of the bonding wire 507 is desirably as close as possible to the bonding point 508b of the bonding wire 508.

The high frequency filter of the igniter 1 is located between the power supply terminal VDD and the power supply pad 201 of the control circuit 13. The high frequency filter is a n-type low pass filter made up of e.g., the capacitors 14 and 16 and the resistor 15. The resistor 15 is connected between the lead 401 (power supply terminal VDD) and the lead 407. The capacitor 14 is connected between the lead 401 and the lead 402 (ground terminal GND). The capacitor 16 is connected between the lead 407 and the lead 402 (ground terminal GND). The lead 407 is connected to the power supply pad 201 of the control circuit 13 by the bonding wire 501. Thus, a high frequency filter for removing high frequency noise from the power supply terminal VDD is provided.

The layout of the internal configuration of the igniter 1 is not limited to the example shown in FIG. 6. Further, the igniter 1 is not limited to being accommodated in the SiP and may be housed in DiP (Dual In-line Package) or ZIP (Zigzag In-line Package). It may also be housed in a surface mount type package.

An example of a manufacturing method of the igniter 1 will be described below.

First, a lead frame including portions to become leads 401 to 408 is prepared. Next, the semiconductor substrates 200, 600, the capacitors 14, 16, and the resistors 15 are mounted on the lead frame.

Figure 7:
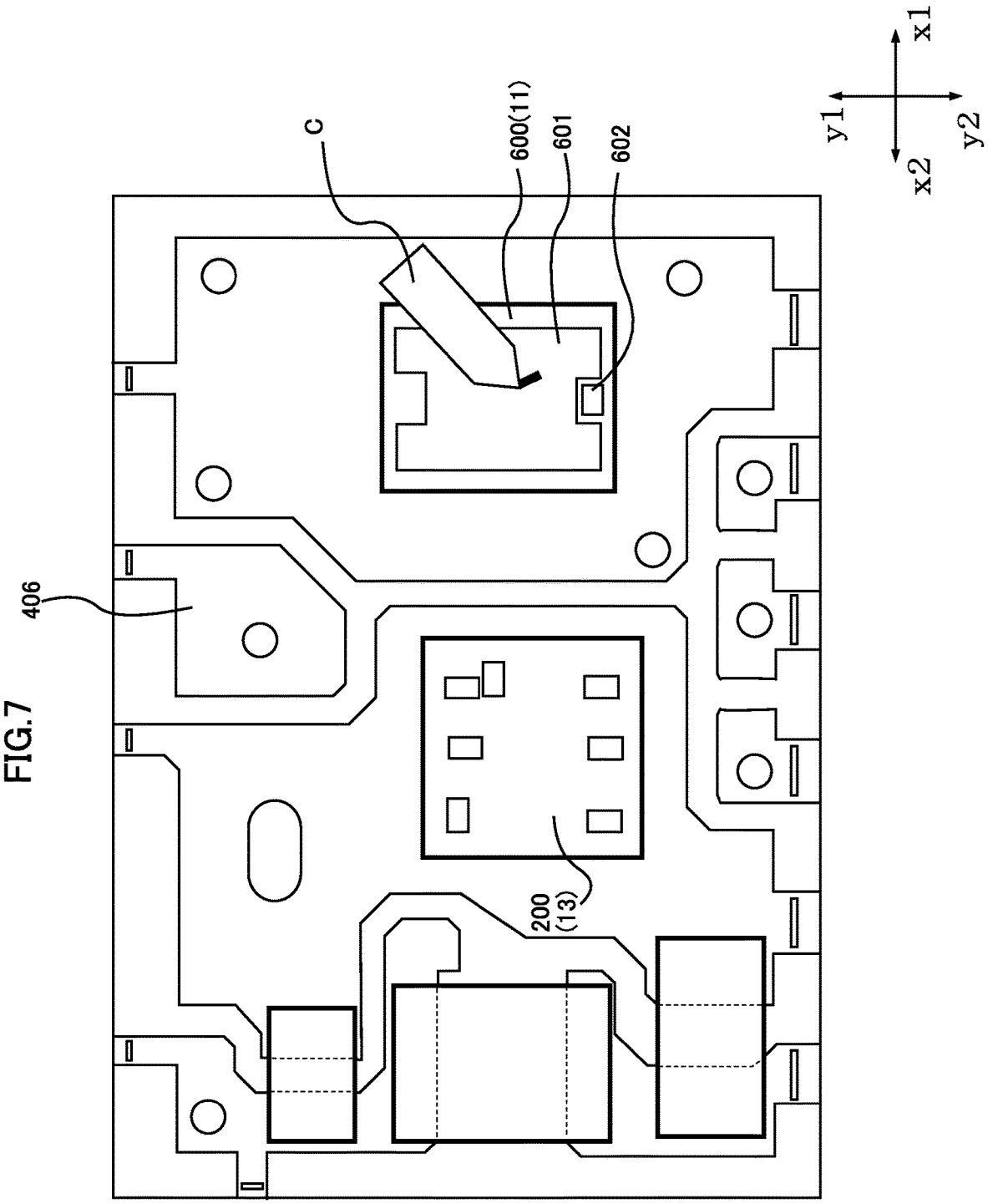
FIG. 7 is a plan view showing a method of manufacturing the igniter of FIG. 1.

The bonding of the bonding wire 509 is performed. As shown in FIG. 7, first, one end of the wire is bonded to the pad 601 (first bonding). Then, while pulling out the wire, the capillary C is moved to the lead 406, and the wire is joined (second bonding) to the lead 406. By cutting a portion of the wire between the bonding point 509a and the tip of the capillary C with a cutter, the bonding wire 509 is formed (see FIG. 8).

Figure 8:
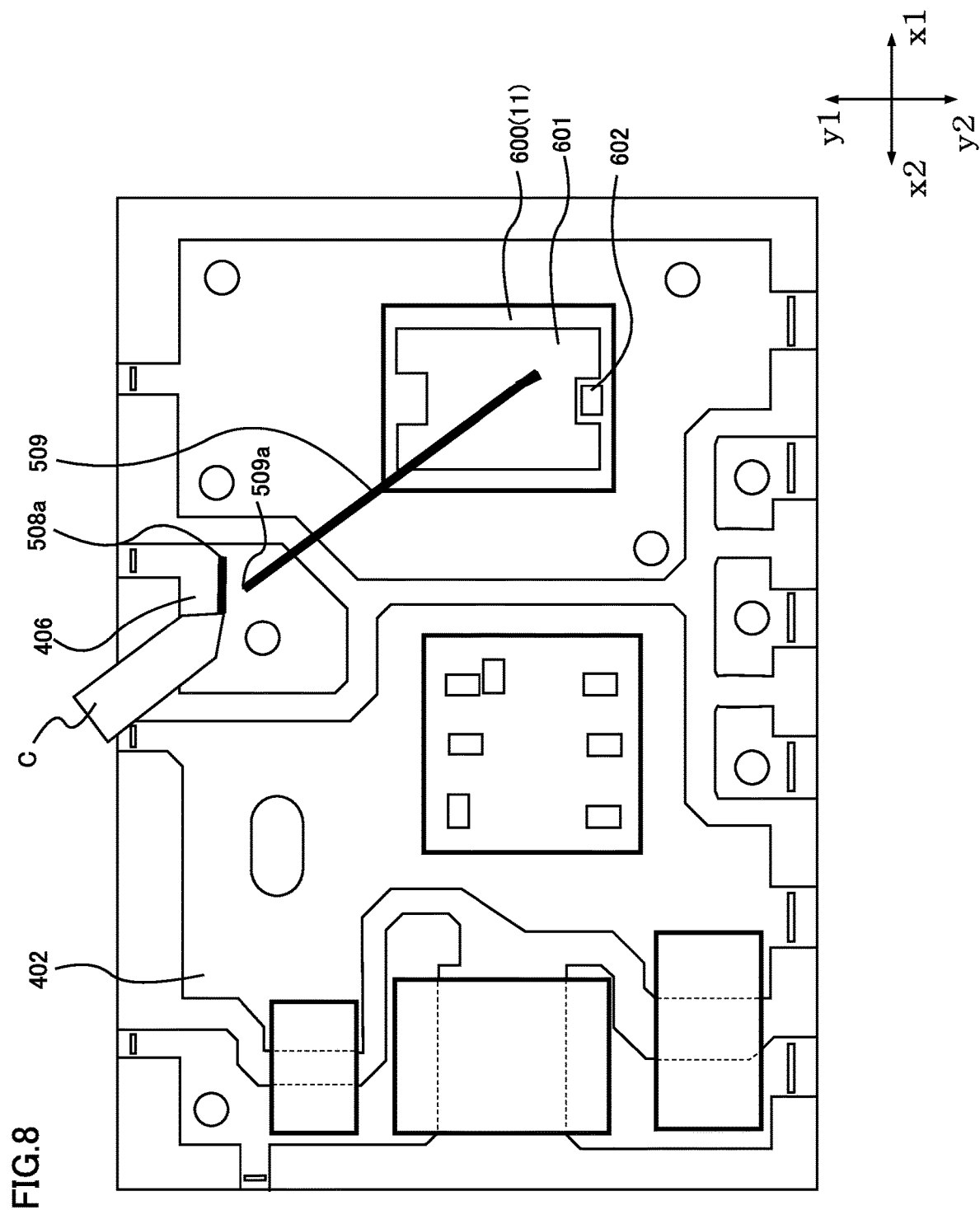
FIG. 8 is another plan view showing the method of manufacturing the igniter of FIG. 1.

Likewise, the bonding wire 508 is formed. As shown in FIG. 8, one end of the wire is joined to the lead 406, where the bonding point (508a) of the wire is offset from the bonding point 509a in the x1 direction and the y1 direction. Next, while pulling out the wire, the capillary C is moved to the lead 402, and the wire is joined to the lead 402. By cutting a portion of the wire between the bonding point and the tip of the capillary C with the cutter, the bonding wire 508 is formed.

Then, the bonding of the bonding wires 501-507 is performed (see FIG. 6). Next, a sealing resin covering the lead frame, the semiconductor substrates 200, 600, the capacitors 14, 16, the resistor 15 and the bonding wires 501 to 509 is formed by, for example, molding. Next, by cutting the predetermined portions of the lead frame, the igniter 1 is obtained. The order of the steps described above may be changed where appropriate. For example, the bonding of the bonding wires 501 to 507 may be performed before the bonding of the bonding wire 509.

Advantages of the igniter 1 will be described below.

In accordance with the above-described embodiment, the pad 601 of the semiconductor substrate 600 and the lead 406 are connected by the bonding wire 509. Further, the lead 406 and the lead 402 are connected by the bonding wire 508, and the lead 406 and the sense input pad 206 are connected by the bonding wire 506. In this manner, the bonding wire 508 is used as the current detection resistor 12. The lead 406 and the bonding wire 508 are less susceptible to the influence of the power cycle. Therefore, even when the bonding point between the bonding wire 509 and the pad 601 (or the pad 601 itself) is deteriorated due to the power cycle, it is possible to prevent the resistance value of the current detection resistor 12 from unduly varying. In other words, malfunction of the ignition confirmation unit 134 can be suppressed.

One bonding point 508a of the bonding wire 508 is arranged on the x1 direction side from both the bonding point 509a of the bonding wire 509 and the bonding point 506a of the bonding wire 506. The other bonding point 508b of the bonding wire 508 is disposed on the x2 direction side of the bonding point 507a of the bonding wire 507. In addition, the bonding wire 508 is formed so that the height of the loop becomes as great as possible. As a result, the bonding wire 508 becomes sufficiently long and the resistance value can be sufficiently large. This contributes to improving the detection accuracy of the ignition confirmation unit 134.

The bonding point 506a of the bonding wire 506 is arranged as close as possible to the bonding point 508a of the bonding wire 508. This makes it possible to suppress the resistance component of the lead 406 between the bonding point 506a and the bonding point 508a from being included in the current detection resistor 12. Further, the bonding point 507a of the bonding wire 507 is disposed as close as possible to the bonding point 508b of the bonding wire 508. Thus, the influence of the resistance component of the lead 402 (between the bonding point 507a and the bonding point 508b) on the voltage detection of the ignition confirmation unit 134 can be suppressed.

At the time of forming the bonding wire 509, the cutting of the wire is performed on the lead 406. Thus, the semiconductor substrate 600 is not damaged by the cutter. Further, the bonding wire 508 is formed after the formation of the bonding wire 509. Specifically, after the second bonding of the bonding wire 509, the first bonding of the bonding wire 508 is performed on the same lead 402, which makes the moving distance of the capillary C advantageously short, thereby contributing to improving the working efficiency. The bonding point 508a of the bonding wire 508 is disposed on the y1 direction side of the bonding point 509a of the bonding wire 509. Thus, the bonding wire 509 does not interfere with the formation of the bonding wire 508.

The bonding wires 501 to 507 are disposed inside the bonding wires 508 and 509 with respect to the semiconductor substrate 200, and the bonding of the wires 501 to 507 is performed after the bonding of the wires 508, 509. Thus, the bonding wires 508 and 509 do not interfere with the bonding process of the bonding wires 501 to 507.

The sense input pad 206 and the sense ground pad 207 are disposed at the end in the y1 direction, and the dimension y6 of the sense input pad 206 in the y direction is longer than the dimension x6 in the x direction. Further, the dimension y7 of the sense ground pad 207 in the y direction is longer than its dimension x7 in the x direction. Thus, the bonding wire 506 or 507, which has a significant component of extension in the y1 direction, can be easily bonded to the corresponding one of the pads 206, 207.

In accordance with the above-noted embodiment, further technical advantages can be enjoyed as follows.

As shown in FIG. 2, the first comparison unit 110 includes a capacitor C11 connected between the non-inverting input terminal and the inverting input terminal of the comparator 111. By smoothing the voltage between the terminals, the capacitor C11 can suppress the phase difference between the voltage (detected voltage Vcs on which noise is superimposed) inputted to the non-inverting input terminal and the voltage inputted to the inverting input terminal (reference voltage Vref1 on which noise is superimposed). Therefore, the high-frequency fluctuation of the reference voltage Vref1 and the high-frequency fluctuation of the detection voltage Vcs coincide in phase, whereby the deterioration of the judgment ability of the comparator 111 is suppressed and the overdrive voltage is lowered. Thus, the rise of the reference voltage Vref1 is suppressed. The same applies to the second comparison unit 120. Specifically, the capacitor C21 is connected between the non-inverting input terminal and the inverting input terminal of the comparator 121, and thus the phase difference of noise is suppressed, and the rise of the reference voltage Vref2 is prevented. Accordingly, the comparators 111 and 121 can perform the same proper determination as in the case where no noise is superimposed. This contributes to preventing the ignition confirmation signal IGF from being disturbed by noise.

Figure 9:
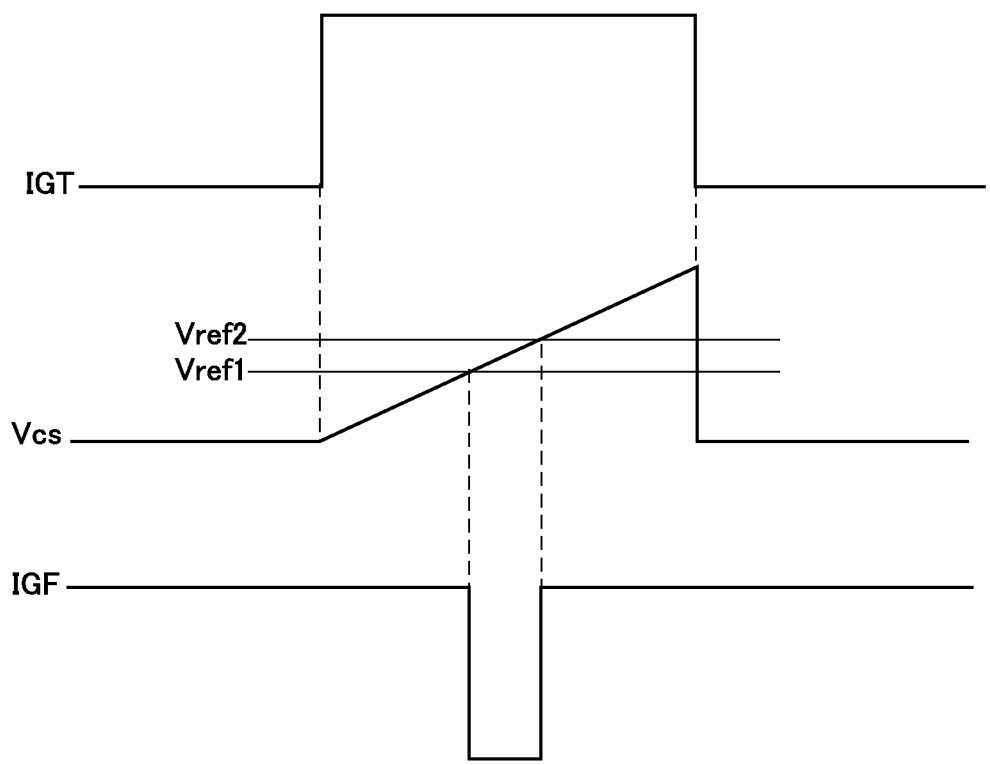
FIG. 9 is a waveform diagram for explaining the operations of the igniter.

FIG. 9 is a diagram illustrating the operations of the igniter 1. As shown, though noise is superimposed, the capacitors C11 and C12 can suppress the phase difference between the voltage inputted to the non-inverting input terminal (detection voltage Vcs) and the voltage inputted to the inverting input terminal (reference voltage Vref1), and hence, the rise of the reference voltages Vref1 and Vref2 is suppressed. Accordingly, the ignition confirmation signal IGF has the same waveform as in the case where no noise is superimposed.

The third comparison unit 130 includes a capacitor C31 connected between the non-inverting input terminal and the inverting input terminal of the comparator 131. As a result, the phase difference of noise is suppressed, and the voltage rising due to noise becomes approximately the same between the detection voltage Vcs and the reference voltage Vref3. Therefore, the comparator 131 can output the same comparison signal S13 as when the noise is not superimposed. The same applies to the fourth comparison unit 140, including the capacitor C41 connected between the non-inverting input terminal and the inverting input terminal of the comparator 141. As a result, the phase difference of the noise is suppressed, and the voltage rising due to the noise becomes approximately the same between the detection voltage Vcs and the reference voltage Vref4. Thus, the comparator 141 can output the same comparison signal S14 as when the noise is not superimposed.

Further, the first comparison unit 110 includes a resistor R12 and a resistor R13. The resistor R12 and the capacitor C11 constitute an RC filter for removing high frequency inputted to the non-inverting input terminal of the comparator 111. The resistor R13 and the capacitor C11 constitute an RC filter for removing the high frequency inputted to the inverting input terminal of the comparator 111. As a result, high-frequency noise to each input terminal of the comparator 111 can be removed. The resistance value of the resistor R12 is approximately equal to the resistance value of R13. In the region 311, the resistor R12 and the resistor R13 are arranged adjacent to each other. Thus, the resistance R12 and the resistance R13 can suppress the influence on the comparison between the detection voltage Vcs and the reference voltage Vref1. The same applies to the second comparison unit 120, the third comparison unit 130, and the fourth comparison unit 140.

The region 310 is located near the sense input pad 206 and the sense ground pad 207. For example, in the first comparison unit 110, the wiring from the sense input pad 206 to the resistor R12 and the wiring from the sense ground pad 207 to the resistor R13 can be formed short. This reduces the parasitic inductance of the current path. Thus, it is possible to suppress the phase difference of noise between the non-inverting input terminal and the inverting input terminal of the comparator.

The region 311 is located equidistant from the sense input pad 206 and the sense ground pad 207. For example, in the first comparison unit 110, the resistors R12 and R13 are arranged adjacent to each other, and thus the wiring from the sense input pad 206 to the resistor R12 and the wiring from the sense ground pad 207 to the resistor R13 are the same in length. This makes it possible to suppress the difference in parasitic inductance of the current path between the above-noted two wiring paths. Thus, it is possible to suppress the phase difference of noise between the non-inverting input terminal and the inverting input terminal of the comparator.

The region 312 is adjacent to the region 311, and the region 313 is adjacent to the region 312. For example, in the first comparison unit 110, each internal wiring can be formed short. This reduces the parasitic inductance of the current path. Thus, it is possible to suppress the phase difference of noise between the non-inverting input terminal and the inverting input terminal of the comparator.

FIG. 10 shows a modified example of the layout of the function IC of the control circuit 13. The illustrated layout differs from the example described above (FIG. 5) in that the four diodes in region 314 are equally spaced apart from each other. According to this configuration, in each of the comparators 111, 121, 131 and 141, wiring to the diode can be shortened.

Figure 11:
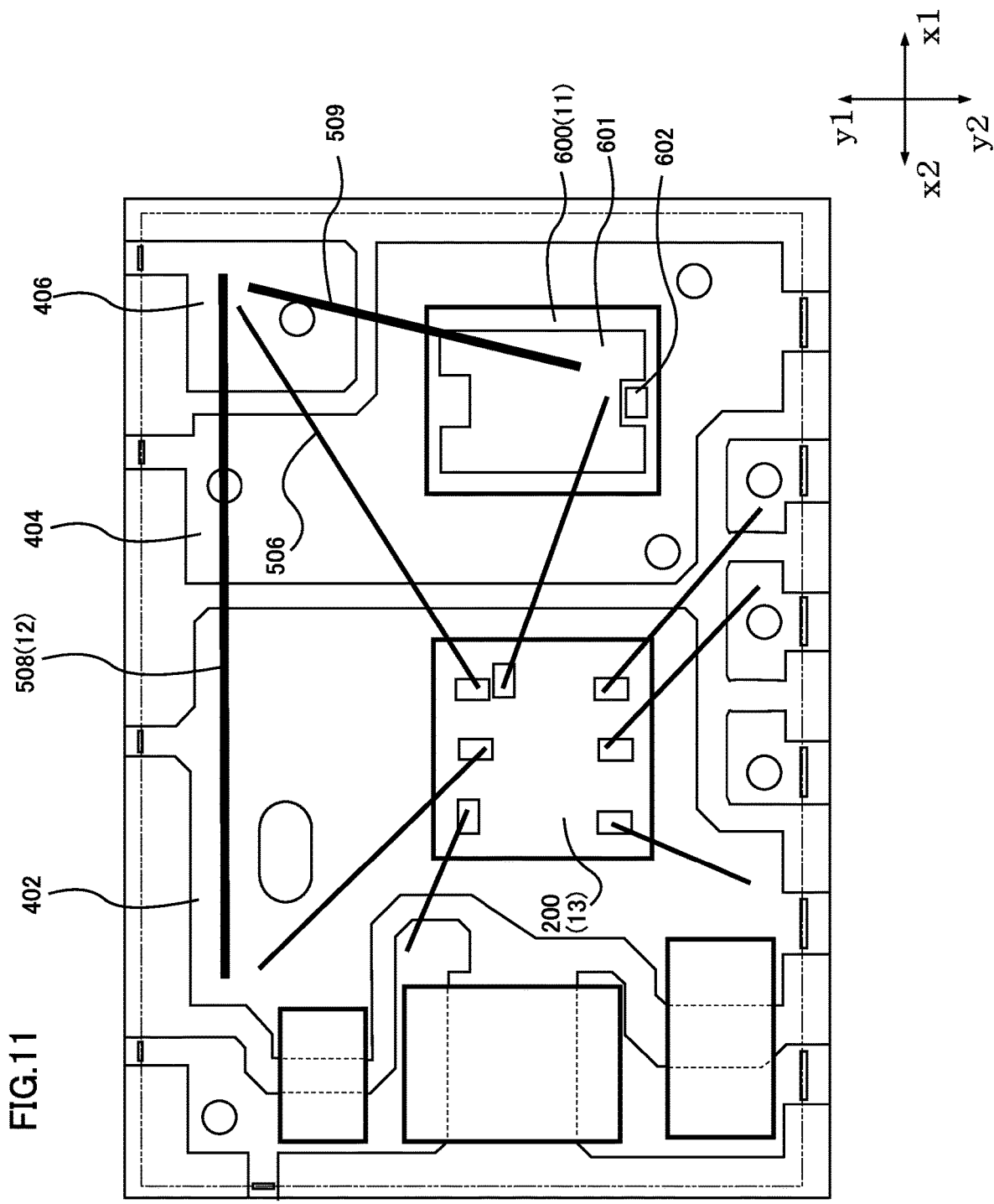
FIG. 11 is a plan view showing an example of the layout of the internal configuration of the igniter.
Figure 12:
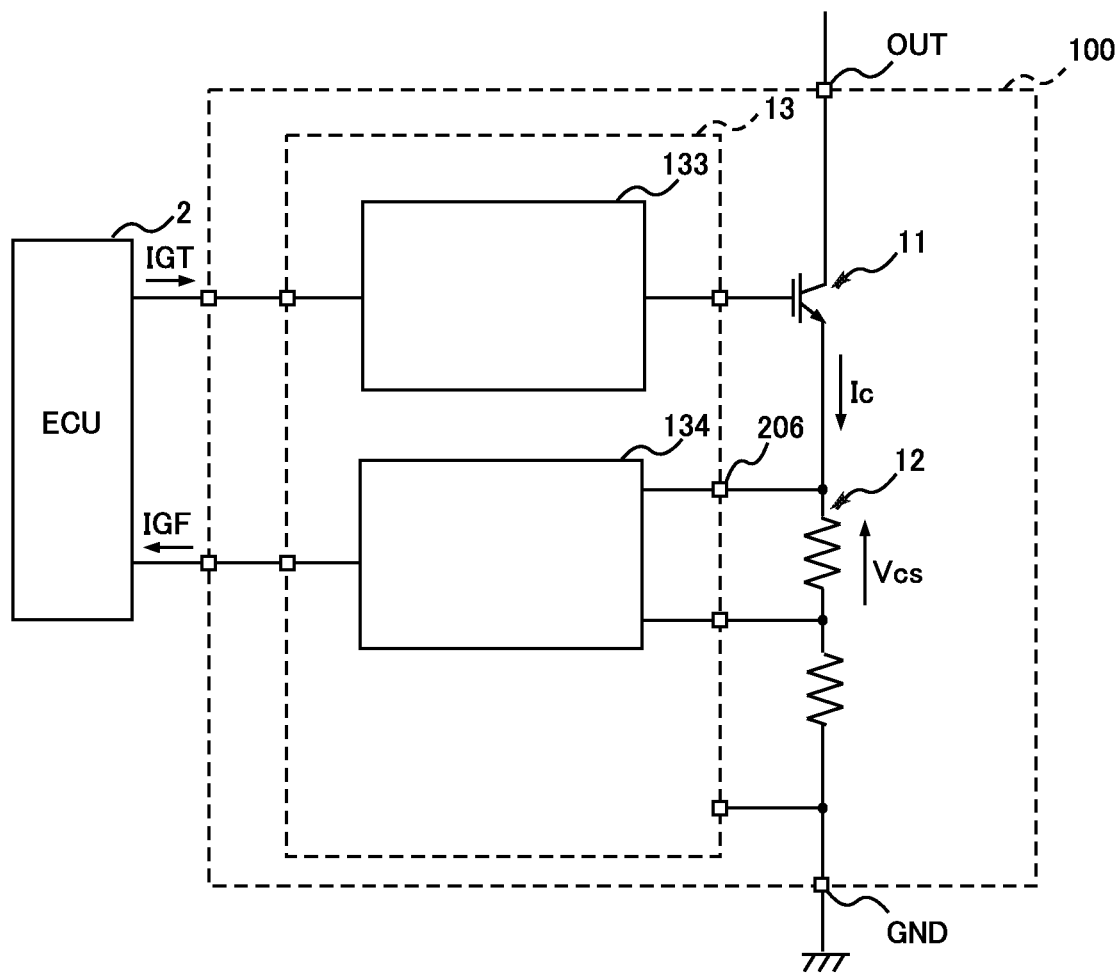
FIG. 12 is a circuit diagram showing a conventional igniter.
Figure 13:
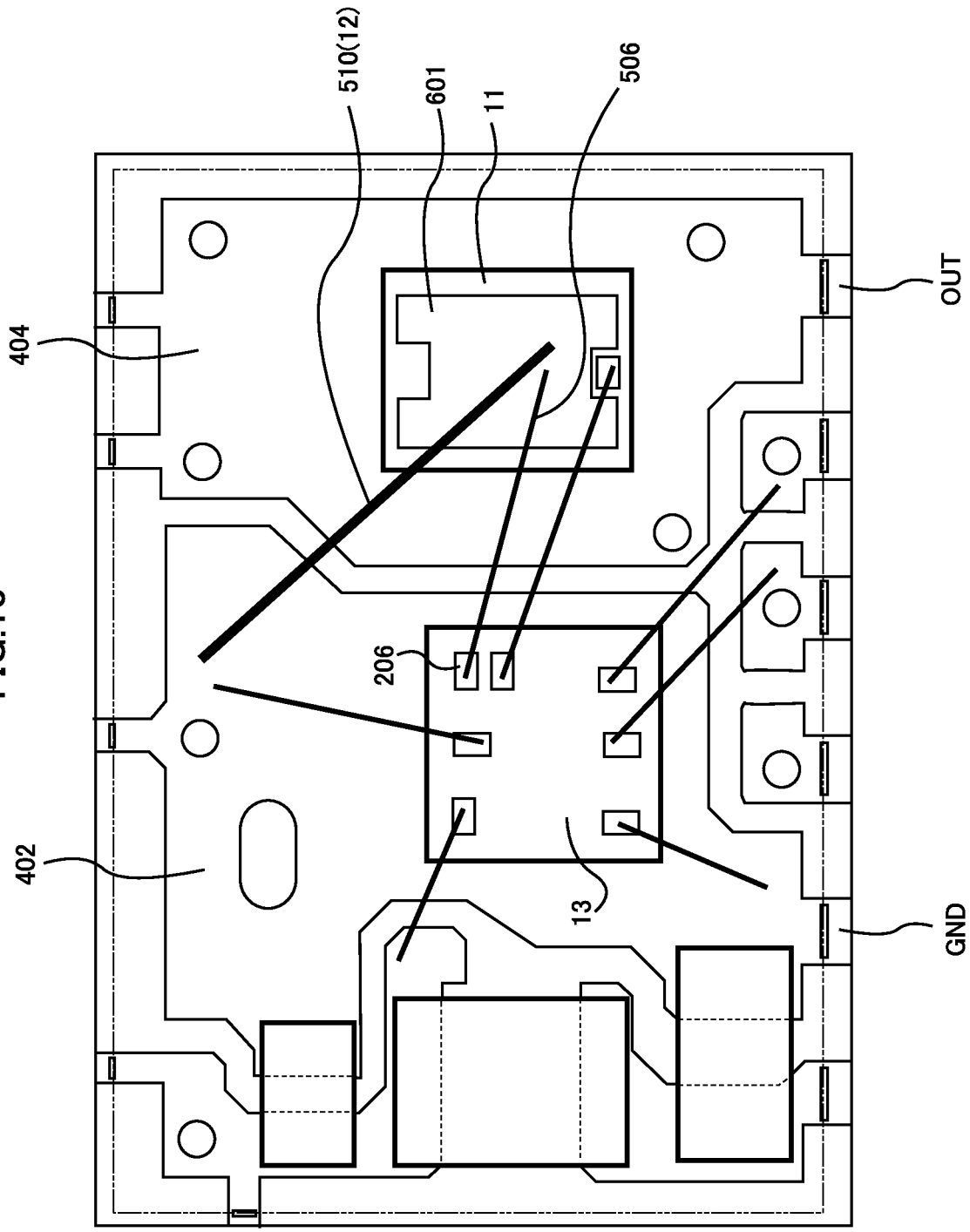
FIG. 13 is a plan view showing the internal configuration of the conventional igniter.
Figure 14A:
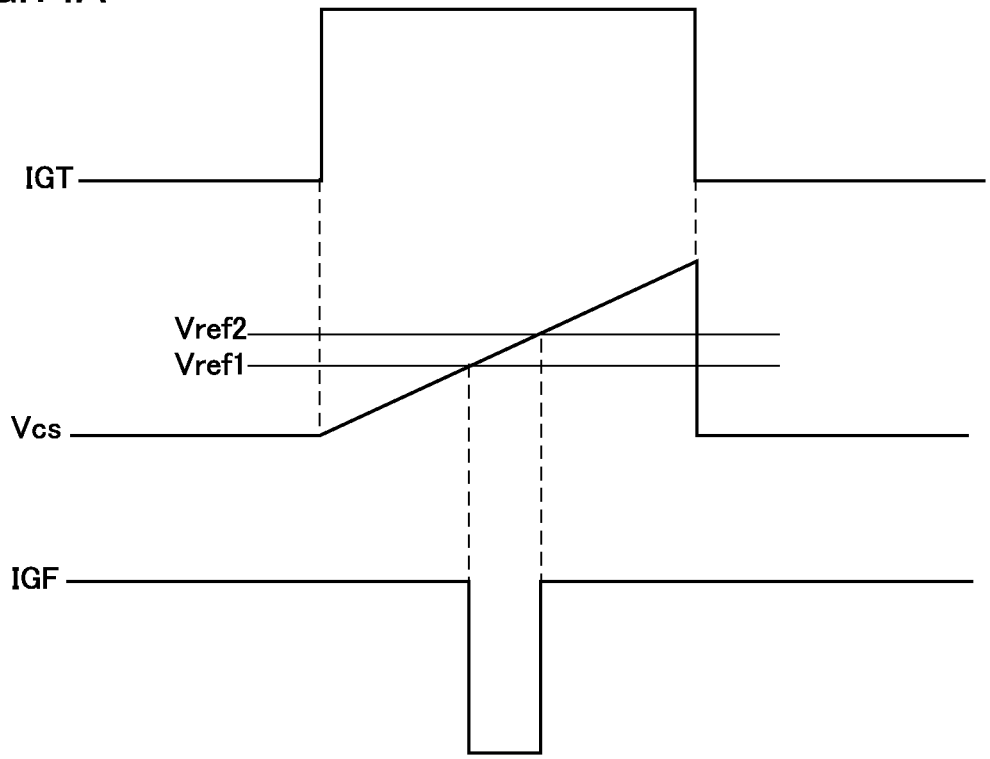
FIGS. 14A-14B are diagrams illustrating the operations of the conventional igniter.
Figure 14B:
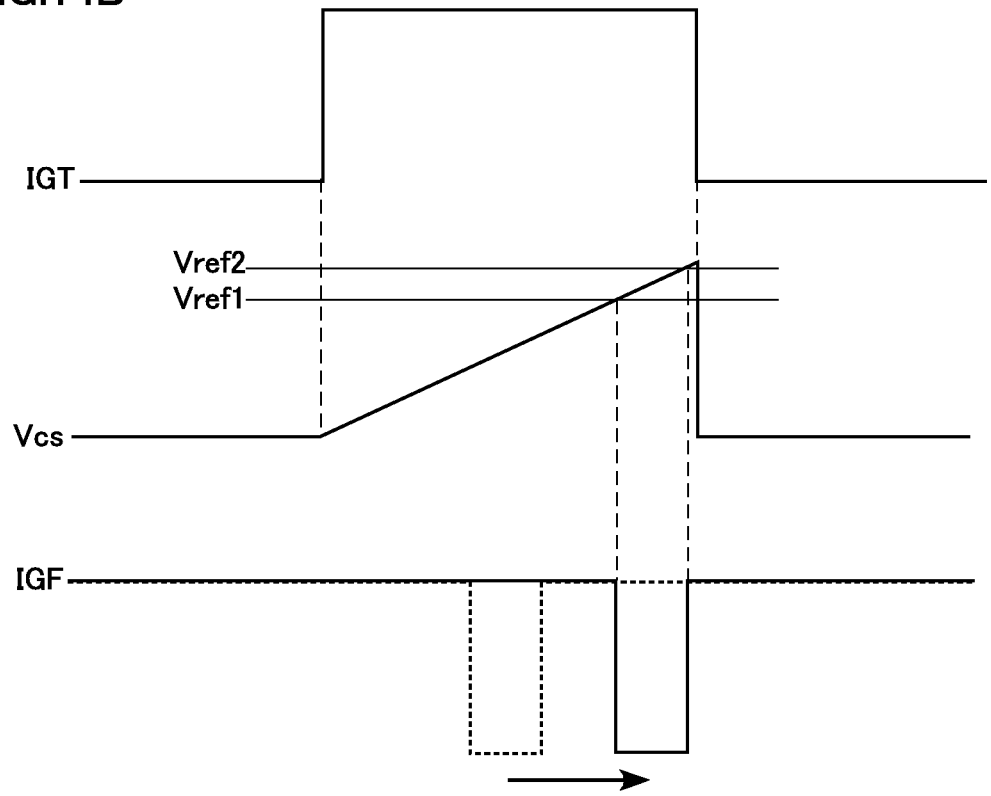

FIG. 11 shows an igniter 1 according to a second embodiment. In the igniter 1 of the second embodiment, the position of the lead 406 is different from that in the first embodiment. The lead 406 of the second embodiment is not disposed between the lead 402 and the lead 404, but at the end of the package in the x1 direction and at the end in the y1 direction, in other words, at the upper right corner of the package.

In the second embodiment, the same technical advantages as in the first embodiment can be enjoyed. In addition, according to the second embodiment, the bonding wire 508 can be longer, which contributes to increasing the resistance value of the current detection resistor 12.

According to various aspects of the present disclosure, an igniter and a vehicle provided with the igniter may be defined as in the following appendixes 1A-15A and 1B-15B.

Appendix 1A. An igniter comprising:
a switch element provided with an input electrode, an output electrode and a control electrode;
a first lead held in contact with the input electrode of the switch element and electrically connected to a primary coil of an ignition coil;
a second lead that is grounded;
a third lead spaced apart from the first lead and the second lead;
a first bonding wire connecting the output electrode and the third lead to each other;
a second bonding wire connecting the third lead and the second lead to each other; and
a control IC that drives the switch element based on an ignition instruction signal from an engine control unit and that generates an ignition confirmation signal based on a voltage of the third lead, the ignition confirmation signal being outputted to the engine control unit.

Appendix 2A. The igniter according to Appendix 1A, wherein the second bonding wire is made of Al.

Appendix 3A. The igniter according to Appendix 1A or 2A, wherein the third lead is disposed between the first lead and the second lead.

Appendix 4A. The igniter according to any one of Appendixes 1A to 3A, wherein the control IC is mounted on the second lead and provided with a first pad and a second pad, the voltage of the third lead being inputted to the first pad, the second pad being grounded, and wherein the first pad and the second pad are disposed along a first direction in which the first lead and the second lead are juxtaposed.

Appendix 5A. The igniter according to Appendix 4A, wherein the second bonding wire is greater in size measured in the first direction than the control IC.

Appendix 6A. The igniter according to Appendix 4A or 5A, wherein in the first direction, a bonding point of the second boding wire to the third lead is offset toward the first lead than is a bonding point of the first bonding wire to the third lead.

Appendix 7A. The igniter according to any one of Appendixes 4A to 6A, wherein in a second direction perpendicular to the first direction and a thickness direction of the first lead, the bonding point of the second bonding wire to the third lead is opposite to the control IC with respect to the bonding point of the first bonding wire to the third lead.

Appendix 8A. The igniter according to any one of Appendixes 4A to 7A, further comprising a third bonding wire connecting the first pad and the third lead to each other.

Appendix 9A. The igniter according to Appendix 8A, wherein the second bonding wire is thicker than the third bonding wire.

Appendix 10A. The igniter according to Appendix 8A or 9A, wherein in a second direction perpendicular to the first direction and a thickness direction of the first lead, the bonding point of the second bonding wire to the third lead is opposite to the control IC with respect to a bonding point of the third bonding wire to the third lead.

Appendix 11A. The igniter according to any one of Appendixes 4A to 10A, further comprising a fourth bonding wire connecting the second pad and the second lead to each other, wherein in the first direction, the bonding point of the second bonding wire to the second lead is opposite to the first lead with respect to a bonding point of the fourth bonding wire to the second lead.

Appendix 12A. The igniter according to any one of Appendixes 4A to 11A, wherein in a second direction perpendicular to the first direction and a thickness direction of the first lead, the first pad and the second pad are disposed at end portions of the control IC that are offset toward the third lead, and wherein each of the first pad and the second pad is greater in size in the second direction than in the first direction.

Appendix 13A. The igniter according to any one of Appendixes 1A to 12A, wherein in a thickness direction of the first lead, a distance between the third lead and a portion of the second bonding wire that is maximally spaced apart from the third lead is greater than a distance between the third lead and a portion of the first bonding wire that is maximally spaced apart from the third lead.

Appendix 14A. The igniter according to any one of Appendixes 1A to 13A, wherein the switch element is an IGBT, the input electrode is a collector electrode, the output electrode is an emitter electrode, and the control electrode is a gate electrode.

Appendix 15A. A vehicle comprising:
an igniter set forth in any one of Appendixes 1A to 14A;
an ignition plug;
an ignition coil provided with a primary coil connected to the first lead and a secondary coil connected to the ignition plug; and
an engine control unit that generates an ignition instruction signal and outputs said signal to the igniter.

Further, according to another aspect of the present disclosure, an igniter and a vehicle provided with the igniter may be defined as in the following appendixes 1B to 15B.

Appendix 1B. An igniter comprising:
an output terminal connected to a primary coil of an ignition coil;
a ground terminal that is grounded;
a switch element connected between the output terminal and the ground terminal;
a current detection resistor connected between the switch element and the ground terminal;
an input terminal to which an ignition instruction signal from an engine control unit is inputted; and
a control circuit that drives the switch element based on the ignition instruction signal;
wherein the control circuit comprises:
a reference voltage resistor including a terminal connected to a low potential terminal of the current detection resistor, the reference voltage resistor being configured to generate a reference voltage;

a comparator including a detection voltage input terminal, a reference voltage input terminal and a comparison result output terminal, the detection voltage input terminal being connected to a high potential terminal of the current detection resistor, the reference voltage input terminal being connected to another terminal of the reference voltage resistor, the comparison result output terminal outputting a comparison result signal generated in accordance with comparison between a voltage inputted to the detection voltage input terminal and a voltage inputted to the reference voltage input terminal; and a capacitor connected between the detection voltage input terminal and the reference voltage input terminal, wherein the control circuit generates an ignition confirmation signal to be outputted to the engine control unit based on the comparison result signal.

Appendix 2B. The igniter according to Appendix 1B, wherein the capacitor has a capacitance in a range of 0.1 to 100 pF.

Appendix 3B. The igniter according to Appendix 1B or 2B, wherein the control circuit comprises a semiconductor substrate in which the reference voltage resistor, the comparator and the capacitor are integrated.

Appendix 4B. The igniter according to Appendix 3B, wherein a region formed with the comparator and a region formed with the capacitor are adjacent to each other.

Appendix 5B. The igniter according to Appendix 3B or 4B, wherein the control circuit comprises a first pad connected to the detection voltage input terminal and a second pad connected to the reference voltage input terminal via the reference voltage resistor, and wherein the first pad and the second pad are disposed in an end portion of the semiconductor substrate in a second direction perpendicular to both a first direction along which the first pad and the second pad are arranged and a thickness direction of the semiconductor substrate.

Appendix 6B. The igniter according to Appendix 5B, wherein each of the first pad and the second pad is longer in the second direction than in the first direction.

Appendix 7B. The igniter according Appendix 5B or 6B, wherein a region formed with the comparator is disposed between the first pad and the second pad in the first direction.

Appendix 8B. The igniter according to any one of Appendixes 5B to 7B, wherein a region formed with the comparator is offset in the second direction from a center of the semiconductor substrate toward the first pad and the second pad.

Appendix 9B. The igniter according to any one of Appendixes 5B to 9B, wherein the control circuit comprises a first resistor and a second resistor, the first resistor being connected between a high potential terminal of the current detection resistor and the detection voltage input terminal, the second resistor being connected between the ground terminal and the reference voltage input terminal.

Appendix 10B. The igniter according to Appendix 9B, wherein the first resistor and the second resistor are adjacent to each other and have a same resistance.

Appendix 11B. The igniter according to Appendix 9B or 10B, wherein a region formed with the first resistor and the second resistor and a region formed with the capacitor are adjacent to each other.

Appendix 12B. The igniter according to any one of Appendixes 9B to 11B, wherein the region formed with the first resistor and the second resistor has a central position in the first direction, the central position being coinciding with a center between mutually facing edges of the first pad and the second pad in the first direction.

Appendix 13B. The igniter according to any one of Appendixes 1B to 12B, wherein the control circuit comprises:

a second reference voltage resistor having an end connected to a low potential terminal of the current detection resistor, the second reference voltage resistor providing a second reference voltage;

a second comparator including a second detection voltage input terminal, a second reference voltage input terminal and a second comparison result output terminal, the second detection voltage input terminal being connected to a high potential terminal of the current detection resistor, the second reference voltage input terminal being connected to another terminal of the second reference voltage resistor, the second comparison result output terminal outputting a second comparison result signal generated in accordance with comparison between a voltage inputted to the second detection voltage input terminal and a voltage inputted to the second reference voltage input terminal; and a second capacitor connected between the second detection voltage input terminal and the second reference voltage input terminal, wherein the control circuit generates the ignition confirmation signal based on said comparison result signal and said second comparison result signal.

Appendix 14B. The igniter according to any one of Appendixes 1B to 13B, wherein the control circuit comprises:

a third reference voltage resistor having an end connected to a low potential terminal of the current detection resistor, the third reference voltage resistor providing a third reference voltage;

a third comparator including a third detection voltage input terminal, a third reference voltage input terminal and a third comparison result output terminal, the third detection voltage input terminal being connected to a high potential terminal of the current detection resistor, the third reference voltage input terminal being connected to another terminal of the third reference voltage resistor, the third comparison result output terminal outputting a third comparison result signal in accordance with comparison between a voltage inputted to the third detection voltage input terminal and a voltage inputted to the third reference voltage input terminal; and a third capacitor connected between the third detection voltage input terminal and the third reference voltage input terminal, wherein the control circuit adjusts driving of the switch element in accordance with the third comparison result signal.

Appendix 15B. A vehicle comprising:
an igniter set forth in any one of Appendixes 1B to 14B;
an ignition plug;
an ignition coil including a primary coil connected to the output terminal and a secondary coil connected to the ignition plug; and
an engine control unit that generates the ignition instruction signal and outputs the ignition instruction signal to the igniter.

The invention claimed is:
1. An igniter comprising:
a switch element provided with an input electrode, an output electrode and a control electrode;

a first lead held in contact with the input electrode of the switch element and electrically connected to a primary coil of an ignition coil;

a second lead that is grounded;

a third lead spaced apart from the first lead and the second lead;

a first bonding wire connecting the output electrode and the third lead to each other;

a second bonding wire connecting the third lead and the second lead to each other; and a control IC that drives the switch element based on an ignition instruction signal from an engine control unit and that generates an ignition confirmation signal based on a voltage of the third lead, the ignition confirmation signal being outputted to the engine control unit, wherein the control IC is mounted on the second lead, the control IC is provided with a first pad and a second pad, the voltage of the third lead being inputted to the first pad, the second pad being grounded, and the first pad and the second pad are disposed along a first direction in which the first lead and the second lead are juxtaposed.

2. The igniter according to claim 1, wherein the second bonding wire is made of Al.

3. The igniter according to claim 1, wherein the second bonding wire is greater in size measured in the first direction than the control IC.

4. The igniter according to claim 1, wherein in the first direction, a bonding point of the second boding wire to the third lead is offset toward the first lead than is a bonding point of the first bonding wire to the third lead.

5. The igniter according to claim 1, wherein in a second direction perpendicular to the first direction and a thickness direction of the first lead, a bonding point of the second bonding wire to the third lead is opposite to the control IC with respect to a bonding point of the first bonding wire to the third lead.

6. The igniter according to claim 1, further comprising a third bonding wire connecting the first pad and the third lead to each other.

7. The igniter according to claim 6, wherein the second bonding wire is thicker than the third bonding wire.

8. The igniter according to claim 6, wherein in a second direction perpendicular to the first direction and a thickness direction of the first lead, a bonding point of the second bonding wire to the third lead is opposite to the control IC with respect to a bonding point of the third bonding wire to the third lead.

9. The igniter according to claim 1, further comprising a fourth bonding wire connecting the second pad and the second lead to each other, wherein in the first direction, a bonding point of the second bonding wire to the second lead is opposite to the first lead with respect to a bonding point of the fourth bonding wire to the second lead.

10. The igniter according to claim 1, wherein in a second direction perpendicular to the first direction and a thickness direction of the first lead, the first pad and the second pad are disposed at end portions of the control IC that are offset toward the third lead, and each of the first pad and the second pad is greater in size in the second direction than in the first direction.

11. The igniter according to claim 1, wherein in a thickness direction of the first lead, a distance between the third lead and a portion of the second bonding wire that is maximally spaced apart from the third lead is greater than a distance between the third lead and a portion of the first bonding wire that is maximally spaced apart from the third lead.

12. The igniter according to claim 1, wherein the switch element is an IGBT, the input electrode is a collector electrode, the output electrode is an emitter electrode, and the control electrode is a gate electrode.

13. A vehicle comprising:

an igniter set forth in claim 1;

an ignition plug;

an ignition coil provided with a primary coil connected to the first lead and a secondary coil connected to the ignition plug; and an engine control unit that generates an ignition instruction signal and outputs said signal to the igniter.

14. An igniter comprising:

an output terminal connected to a primary coil of an ignition coil;

a ground terminal that is grounded;

a switch element connected between the output terminal and the ground terminal;

a current detection resistor connected between the switch element and the ground terminal;

an input terminal to which an ignition instruction signal from an engine control unit is inputted; and a control circuit that drives the switch element based on the ignition instruction signal;

wherein the control circuit comprises:

a reference voltage resistor including a terminal connected to a low potential terminal of the current detection resistor, the reference voltage resistor producing a reference voltage;

a comparator including:

a detection voltage input terminal, a reference voltage input terminal and a comparison result output terminal, the detection voltage input terminal being connected to a high potential terminal of the current detection resistor, the reference voltage input terminal being connected to another terminal of the reference voltage resistor, and the comparison result output terminal outputting a comparison result signal generated in accordance with comparison between a voltage inputted to the detection voltage input terminal and a voltage inputted to the reference voltage input terminal; and a capacitor connected between the detection voltage input terminal and the reference voltage input terminal, wherein the control circuit generates an ignition confirmation signal to be outputted to the engine control unit based on the comparison result signal.

15. The igniter according to claim 14, wherein the capacitor has a capacitance in a range of 0.1 to 100 pF.

16. The igniter according to claim 14, wherein the control circuit comprises a semiconductor substrate in which the reference voltage resistor, the comparator and the capacitor are integrated.

17. The igniter according to claim 16, wherein a region formed with the comparator and a region formed with the capacitor are adjacent to each other.

18. The igniter according to claim 16, wherein the control circuit comprises:

a first pad connected to the detection voltage input terminal; and a second pad connected to the reference voltage input terminal via the reference voltage resistor, and wherein the first pad and the second pad are disposed in an end portion of the semiconductor substrate in a second direction perpendicular to both a first direction along which the first pad and the second pad are arranged and a thickness direction of the semiconductor substrate.

19. The igniter according to claim 18, wherein each of the first pad and the second pad is longer in the second direction than in the first direction.

20. The igniter according claim 18, wherein a region formed with the comparator is disposed between the first pad and the second pad in the first direction.

21. The igniter according to claim 18, wherein a region formed with the comparator is offset in the second direction from a center of the semiconductor substrate toward the first pad and the second pad.

22. The igniter according to claim 18, wherein the control circuit comprises a first resistor and a second resistor, the first resistor being connected between the high potential terminal of the current detection resistor and the detection voltage input terminal, the second resistor being connected between the ground terminal and the reference voltage input terminal.

23. The igniter according to claim 22, wherein the first resistor and the second resistor are adjacent to each other and have a same resistance.

24. The igniter according to claim 22, wherein a region formed with the first resistor and the second resistor and a region formed with the capacitor are adjacent to each other.

25. The igniter according to claim 22, wherein the region formed with the first resistor and the second resistor has a central position in the first direction, the central position being coinciding with a center between mutually facing edges of the first pad and the second pad in the first direction.

26. The igniter according to claim 14, wherein the control circuit comprises:
a second reference voltage resistor having an end connected to the low potential terminal of the current detection resistor, the second reference voltage resistor producing a second reference voltage;
a second comparator including:
a second detection voltage input terminal,
a second reference voltage input terminal, and
a second comparison result output terminal,
the second detection voltage input terminal being connected to the high potential terminal of the current detection resistor,
the second reference voltage input terminal being connected to another terminal of the second reference voltage resistor, and
the second comparison result output terminal outputting a second comparison result signal generated in accordance with comparison between a voltage inputted to the second detection voltage input terminal and a voltage inputted to the second reference voltage input terminal; and
a second capacitor connected between the second detection voltage input terminal and the second reference voltage input terminal,
wherein the control circuit generates the ignition confirmation signal based on said comparison result signal and said second comparison result signal.

27. The igniter according to claim 14, wherein the control circuit comprises:
a third reference voltage resistor having an end connected to the low potential terminal of the current detection resistor, the third reference voltage resistor providing a third reference voltage;
a third comparator including:
a third detection voltage input terminal,
a third reference voltage input terminal and a third comparison result output terminal, and
the third detection voltage input terminal being connected to the high potential terminal of the current detection resistor,
the third reference voltage input terminal being connected to another terminal of the third reference voltage resistor,
the third comparison result output terminal outputting a third comparison result signal in accordance with comparison between a voltage inputted to the third detection voltage input terminal and a voltage inputted to the third reference voltage input terminal; and
a third capacitor connected between the third detection voltage input terminal and the third reference voltage input terminal,
wherein the control circuit adjusts driving of the switch element in accordance with the third comparison result signal.

28. A vehicle comprising:
an igniter set forth in claim 14;
an ignition plug;
an ignition coil including a primary coil connected to the output terminal and a secondary coil connected to the ignition plug; and
an engine control unit that generates the ignition instruction signal and outputs the ignition instruction signal to the igniter.

* * * * *